(12) United States Patent
Rachmady et al.

(10) Patent No.: US 11,164,974 B2
(45) Date of Patent: Nov. 2, 2021

(54) CHANNEL LAYER FORMED IN AN ART TRENCH

(71) Applicant: INTEL CORPORATION, Santa Clara, CA (US)

(72) Inventors: Willy Rachmady, Beaverton, OR (US); Matthew V. Metz, Portland, OR (US); Gilbert Dewey, Beaverton, OR (US); Nancy Zelick, Portland, OR (US); Harold Kennel, Portland, OR (US); Nicholas G. Minutillo, Hillsboro, OR (US); Cheng-Ying Huang, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 17 days.

(21) Appl. No.: 16/631,363

(22) PCT Filed: Sep. 29, 2017

(86) PCT No.: PCT/US2017/054225
§ 371 (c)(1),
(2) Date: Jan. 15, 2020

(87) PCT Pub. No.: WO2019/066885
PCT Pub. Date: Apr. 4, 2019

(65) Prior Publication Data
US 2020/0220017 A1    Jul. 9, 2020

Related U.S. Application Data

(63) Continuation of application No. PCT/US2017/054225, filed on Sep. 29, 2017.

(51) Int. Cl.
*H01L 29/78* (2006.01)
*H01L 29/66* (2006.01)
(Continued)

(52) U.S. Cl.
CPC .. *H01L 29/7851* (2013.01); *H01L 21/823412* (2013.01); *H01L 21/823431* (2013.01);
(Continued)

(58) Field of Classification Search
CPC .......... H01L 29/66795; H01L 29/6681; H01L 29/785–7851; H01L 29/78681;
(Continued)

(56) References Cited

U.S. PATENT DOCUMENTS 8,173,551 B2    5/2012  Bai et al.
9,099,388 B2 *  8/2015  Lin ..................... H01L 29/0653
(Continued)

FOREIGN PATENT DOCUMENTS

WO    2016105377 A1    6/2016
WO  WO-2016105377 A1 *  6/2016  ........... H01L 29/785
(Continued)

OTHER PUBLICATIONS

International Preliminary Report on Patentability received for PCT Application No. PCT/US2017/054225. dated Apr. 9, 2020. 14 pages.
(Continued)

*Primary Examiner* — Errol V Fernandes
*Assistant Examiner* — Jeremy J Joy
(74) *Attorney, Agent, or Firm* — Schwabe, Williamson & Wyatt, P.C.

(57) ABSTRACT

A transistor includes a semiconductor fin with a subfin layer of a subfin material selected from a first group III-V compound a channel layer of a channel material directly on the subfin layer and extending upwardly therefrom, the channel material being a second group III-V compound different from the first group III-V compound. A gate structure is in direct contact with the channel layer of the semiconductor fin, where the gate structure is further in direct contact with
(Continued)

one of (i) a top surface of the subfin layer, the top surface being exposed where the channel layer meets the subfin layer because the channel layer is narrower than the subfin layer, or (ii) a liner layer of liner material in direct contact with opposing sidewalls of the subfin layer, the liner material being distinct from the first and second group III-V compounds.

18 Claims, 12 Drawing Sheets

(51) Int. Cl.
  *H01L 29/201* (2006.01)
  *H01L 21/8234* (2006.01)
  *H01L 27/088* (2006.01)
(52) U.S. Cl.
  CPC ........ *H01L 27/0886* (2013.01); *H01L 29/201* (2013.01); *H01L 29/6681* (2013.01); *H01L 29/66522* (2013.01)
(58) Field of Classification Search
  CPC ......... H01L 29/78696; H01L 29/42392; H01L 29/66439; H01L 29/0673; H01L 29/775; H01L 29/66469; H01L 29/66545; H01L 29/20; H01L 29/201; H01L 29/66522; H01L 29/66446; H01L 21/02455; H01L 21/02538; H01L 21/823821; H01L 21/823431; H01L 21/823412
  See application file for complete search history.

(56) References Cited

U.S. PATENT DOCUMENTS

| | | | |
|---|---|---|---|
| 9,496,401 B1 * | 11/2016 | Cheng | H01L 29/7851 |
| 9,941,150 B1 * | 4/2018 | Bi | H01L 21/31116 |
| 2014/0213037 A1 * | 7/2014 | LiCausi | H01L 21/3105 438/429 |
| 2014/0273398 A1 * | 9/2014 | Holland | H01L 21/02043 438/400 |
| 2015/0162404 A1 | 6/2015 | Yang et al. | |
| 2015/0295087 A1 * | 10/2015 | Cheng | H01L 29/66545 257/192 |
| 2015/0340473 A1 | 11/2015 | Lin et al. | |
| 2015/0357443 A1 * | 12/2015 | Ching | H01L 29/785 257/190 |
| 2015/0364603 A1 * | 12/2015 | Cheng | H01L 29/0673 257/192 |
| 2015/0380258 A1 * | 12/2015 | Liu | H01L 29/205 257/192 |
| 2016/0204208 A1 * | 7/2016 | Goel | H01L 21/02502 257/190 |
| 2016/0329326 A1 | 11/2016 | Balakrishnan et al. | |
| 2017/0229543 A1 * | 8/2017 | Glass | H01L 29/1054 |
| 2017/0263706 A1 * | 9/2017 | Gardner | H01L 29/42392 |
| 2017/0278964 A1 * | 9/2017 | Mohapatra | H01L 29/7827 |
| 2017/0323955 A1 * | 11/2017 | Rachmady | H01L 29/66484 |
| 2017/0323963 A1 * | 11/2017 | Gardner | H01L 29/1054 |
| 2018/0151677 A1 * | 5/2018 | Glass | H01L 29/0653 |
| 2018/0158944 A1 * | 6/2018 | Mohapatra | H01L 29/785 |
| 2019/0067027 A1 * | 2/2019 | Wang | H01L 29/7853 |
| 2020/0044059 A1 * | 2/2020 | Ma | H01L 29/785 |

FOREIGN PATENT DOCUMENTS

| | | | | |
|---|---|---|---|---|
| WO | WO-2016105404 A1 * | 6/2016 | ......... | H01L 29/1054 |
| WO | 2016209210 A1 | 12/2016 | | |
| WO | WO-2016209210 A1 * | 12/2016 | ......... | H01L 29/1054 |
| WO | WO-2016209219 A1 * | 12/2016 | ......... | H01L 27/0924 |
| WO | 2019066885 A1 | 4/2019 | | |

OTHER PUBLICATIONS

International Search Report and Written Opinion received for PCT Application No. PCT/US2017/054225. dated Jun. 29, 2018. 17 pages.

* cited by examiner

CHANNEL LAYER FORMED IN AN ART TRENCH

CROSS REFERENCE TO RELATED APPLICATIONS

This application is a U.S. national stage entry under 35 U.S.C. § 371(c) of International Application No. PCT/US17/54225, filed Sep. 29, 2017, the disclosure of which is incorporated by reference herein in its entirety.

BACKGROUND

Semiconductor devices are electronic components that exploit the electronic properties of semiconductor materials, such as silicon (Si), germanium (Ge), gallium arsenide (GaAs), and indium phosphide (InP). A field-effect transistor (FET) is a semiconductor device that includes three terminals: a gate, a source, and a drain. A FET uses an electric field applied by the gate to control the electrical conductivity of a channel through which charge carriers (e.g., electrons or holes) flow between the source and drain. In instances where the charge carriers are electrons, the FET is referred to as an n-channel device, and in instances where the charge carriers are holes, the FET is referred to as a p-channel device. Some FETs have a fourth terminal called the body or substrate, which can be used to bias the transistor. In addition, metal-oxide-semiconductor FETs (MOSFETs) include a gate dielectric between the gate and the channel. MOSFETs may also be known as metal-insulator-semiconductor FETs (MISFETSs) or insulated-gate FETs (IGFETs). Complementary MOS (CMOS) structures use a combination of p-channel MOSFET (PMOS) and n-channel MOSFET (NMOS) devices to implement logic gates and other digital circuits.

A FinFET is a MOSFET transistor built around a thin strip of semiconductor material (generally referred to as a fin). The conductive channel of the FinFET device resides on the outer portions of the fin adjacent to the gate dielectric. Specifically, current runs along/within both sidewalls of the fin (sides perpendicular to the substrate surface) as well as along the top of the fin (side parallel to the substrate surface). Because the conductive channel of such configurations includes three different planer regions of the fin (e.g., top and two sides), such a FinFET design is sometimes referred to as a tri-gate transistor. Other types of FinFET configurations are also available, such as so-called double-gate Fin-FETs, in which the conductive channel principally resides only along the two sidewalls of the fin (and not along the top of the fin). A nanowire transistor (sometimes referred to as a gate-all-around (GAA) or nanoribbon transistor) is configured similarly to a fin-based transistor, but instead of a finned channel region with the gate on two or three portions, one or more nanowires are used for the channel region and the gate material generally surrounds or encircles each nanowire (hence, gate-all-around).

BRIEF DESCRIPTION OF THE DRAWINGS

FIG. 10 also shows an enlarged portion of one subfin area showing the exposed top surface of the subfin and lined trench sidewalls extending up from the subfin material.

Figure 1:
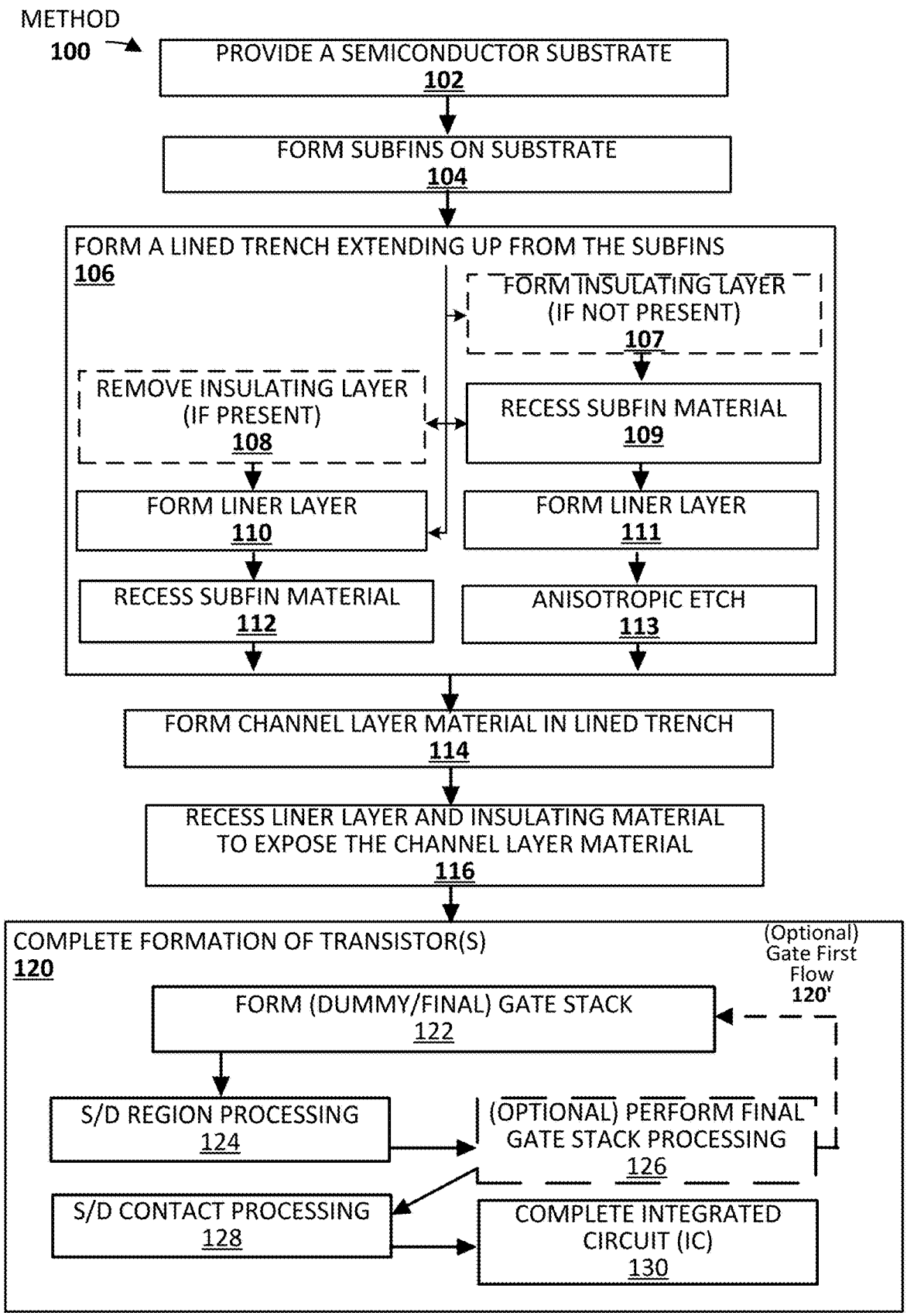
FIG. 1 is a flow chart showing processes in a method of forming a transistor or integrated circuit, where the transistor channel has improved crystal quality, in accordance with some embodiments of the present disclosure.

These and other features of the present embodiments will be understood better by reading the following detailed description, taken together with the figures herein described. In the drawings, each identical or nearly identical component that is illustrated in various figures may be represented by a like numeral. For purposes of clarity, not every component may be labeled in every drawing. Furthermore, as will be appreciated, the figures are not necessarily drawn to scale or intended to limit the described embodiments to the specific configurations shown. For instance, while some figures generally indicate straight lines, right angles, and smooth surfaces, an actual implementation of the disclosed techniques may have less than perfect straight lines and right angles, and some features may have surface topography or otherwise be non-smooth, given real-world limitations of fabrication processes. Further still, some of the features in the drawings may include a patterned and/or shaded fill, which is merely provided to assist in visually identifying the different features. In short, the figures are provided merely to show example structures.

DETAILED DESCRIPTION

Techniques are disclosed for forming Group III-V semiconductor fins in a trench, where the fin has improved crystal quality over standard methods.

General Overview

To form the fin-shaped active channel of the FET, for example, indium phosphide can be grown in a trench formed in an insulating layer, such as silicon dioxide ($SiO_2$) or silicon nitride (SiN). The trench, sometimes referred to as an aspect ratio trapping trench or "ART" trench, extends through the insulating layer at least to, and sometimes into, the semiconductor substrate. In devices having an indium phosphide channel on silicon, a thin subfin layer of gallium arsenide or other III-V material can be used as the interface between the silicon base and the indium phosphide channel layer. For example, a subfin layer of gallium arsenide (GaAs) is grown in the trench in contact with the silicon base or substrate. After recessing the GaAs subfin material in the trench to the desired height, the active channel layer of indium phosphide (InP) is grown in the trench on top of the subfin material. The insulating layer is then removed to expose the indium phosphide channel for additional processing steps, such as forming the gate over the fins of indium phosphide channel material and completing the transistor structure. However, when indium phosphide is grown in a trench formed in $SiO_2$, it is prone to a very high density of stacking faults emanating from the $InP/SiO_2$ interface along the sidewalls of the trench. Regardless of the subfin material, InP grown in a $SiO_2$ trench shows a high density of stacking faults emanating from the $SiO_2$ sidewalls of the trench. Stacking faults are defects that reduce the conductivity of the channel material and therefore reduce the drain current and power efficiency of the transistor. In such cases, stacking faults significantly reduce the carrier mobility of the indium phosphide, such as to a value of about 50 $cm^2/vs$. Therefore, to improve the performance of a FET using an indium phosphide channel material, it would be desirable to eliminate or reduce stacking faults in the channel material emanating from the interface between the trench sidewall and channel layer material.

Thus, and in accordance with various embodiments of the present disclosure, techniques are provided for forming a channel layer in a trench, where the channel layer has improved crystal quality relative to processes prone to stacking faults. In one specific embodiment, the channel material is indium phosphide, where the indium phosphide is virtually free of stacking faults as analyzed using transmission electron microscopy (TEM). Stated another way, the indium phosphide has fewer than 1E6 stacking faults per $cm^2$. In some embodiments of the present disclosure, a layer of liner material is disposed on the fins during the fin forming process, and part of the liner remains adjacent to the subfin. In other embodiments of the present disclosure, a layer of liner material is disposed on the sidewalls of the trench to eliminate an interface between the insulator (e.g., $SiO_2$) and the channel layer material (e.g., InP) during growth of the channel layer. In such cases, the liner material is more sacrificial in nature, although residual liner material may remain, as will be appreciated in light of this disclosure. The liner material can be a semiconductor that is substantially lattice matched to the active channel layer material. For example, when the channel layer material is indium phosphide, the liner material is indium gallium arsenide (InGaAs) or other group III-V material with no more than 4% lattice mismatch to the channel layer material. Indium phosphide or other channel layer material is grown or formed in the lined channel on the sub fin material (e.g., GaAs) and between the lined trench sidewalls to form the channel layer with improved crystal quality.

In another embodiment of the present disclosure, the liner material is a non-$SiO_2$ dielectric, rather than a group III-V semiconductor. Similarly, the channel material (e.g., InP) is subsequently grown in the lined trench on the subfin layer and between the lined trench sidewalls. Regardless of whether the liner material is a dielectric material or a group III-V material, the liner material is selected such that the channel material can be grown in the lined trench with virtually no defects. In some embodiments, the liner material is amorphous or polycrystalline material. In other embodiments, the liner material is a cladding disposed over a subfin material, where the liner material is a III-V material with no more than 4% lattice mismatch to the channel material. For example, the channel material is InP grown epitaxially in a trench lined with InGaAs, where there is no $InP/SiO_2$ interface during growth and the resulting InP is virtually free of stacking faults. The surrounding oxide (or other insulator material) and liner material are subsequently recessed to expose the active fin channel for the transistor. Further processing may be completed to complete the transistor.

In some embodiments, a transistor device processed in accordance with the present disclosure includes a substrate comprising a substrate material disposed along a horizontal plane. In some embodiments, the substrate material is monocrystalline silicon. Other materials are acceptable for the substrate material, including group IV and group III-V semiconductor materials. A fin extends a fin height vertically up from the substrate material. The fin includes a subfin layer of a subfin material different from the underlying substrate material, where the subfin material is formed on the substrate material and extends upwardly therefrom. The fin also includes a channel layer of a channel material different from the subfin material, where the channel material is formed on the subfin material and extends upwardly therefrom. The channel material exhibits reduced stacking faults, resulting in improved carrier mobility over channel material formed according to methods prone to stacking faults. In some embodiments, for example, the channel material is indium phosphide has exhibits virtually no defects.

In some embodiments, the subfin of one or more transistor devices may be part of the substrate, such as in the case of an embodiment having a gallium arsenide substrate and gallium arsenide subfins. In other embodiments, the subfins may be distinct from the substrate such as when the substrate is silicon and the subfin is gallium arsenide. In some such embodiments, the silicon base can be used as a template or a seeding layer from which to form various different channel region materials, as will be described in more detail below. Further, in some such embodiments, the substrate may be oppositely type doped relative to the overlying channel region material to provide a tunnel diode that helps reduce or eliminate parasitic leakage (e.g., subthreshold leakage). For instance, in some embodiments, the silicon base may be intentionally p-type doped (e.g., with a doping concentration of at least 1E16, 5E16, 1E17, 5E17, 1E18, 5E18, or 1E19 atoms per cubic centimeter) if the overlying channel region is to be n-type doped, or vice versa, where the silicon base may be intentionally n-type doped (e.g., with a doping concentration of at least 1E16, 5E16, 1E17, 5E17, 1E18, 5E18, or 1E19 atoms per cubic centimeter) if the overlying channel region is to be p-type doped.

In some embodiments, the silicon base may include an additional thin film layer, such as a semiconductor material layer with a vertical thickness in the range of 20-500 nm (or in a subrange of 20-50, 20-100, 20-200, 20-300, 20-400, 50-100, 50-200, 50-300, 50-400, 50-500, 100-250, 100-400, 100-500, 200-400, or 200-500 nm) and/or a maximum vertical thickness of at most 500, 450, 400, 350, 300, 250, 200, 150, 100, or 50 nm, for example. As can be understood based on this disclosure, employing a sub-500 nm thin film layer can help reduce or prevent undesired wafer bowing. Other suitable thickness values, ranges, and thresholds will be apparent in light of this disclosure.

The use of "group IV semiconductor material" (or "group IV material" or generally, "IV") herein includes at least one group IV element (e.g., silicon, germanium, carbon, tin), such as silicon (Si), germanium (Ge), silicon-germanium (SiGe), and so forth. The use of "group III-V semiconductor material" (or "group III-V material" or generally, "III-V") herein includes at least one group III element (e.g., aluminum, gallium, indium) and at least one group V element (e.g., nitrogen, phosphorus, arsenic, antimony, bismuth), such as gallium arsenide (GaAs), indium gallium arsenide (InGaAs), indium aluminum arsenide (InAlAs), gallium phosphide (GaP), gallium antimonide (GaSb), indium phosphide (InP), gallium nitride (GaN), and so forth. Note that group III may also be known as the boron group or IUPAC group 13, group IV may also be known as the carbon group or IUPAC group 14, and group V may also be known as the nitrogen family or IUPAC group 15, for example.

Note also that the term "compositionally different" as used herein with respect to semiconductor materials or features/layers/structures including semiconductor material means (at least) including different semiconductor materials or including the same semiconductor material but with a different compositional ratio (e.g., where the concentration of at least one component of the material is different). For instance, Ge is compositionally different than InGaAs (as they are different semiconductor materials), but $Si_{0.7}Ge_{0.3}$ is also compositionally different than $Si_{0.4}Ge_{0.6}$ (as they include different compositional ratios). Moreover, SiGe with a Ge concentration in the range of 0 to 30 atomic percentage is compositionally different than SiGe with a Ge concentration in the range of 31 to 100 atomic percentage. The same applies to layers that are said to be "distinct" from one another.

In some embodiments, a plurality of channel layers of different channel materials may be formed on different areas of the substrate, such as for CMOS applications, for example. For instance, a first channel material layer may be formed on a first area of a silicon base to be used for one or more p-channel transistor devices (e.g., one or more PMOS devices) and a second channel material layer may be formed on a second area of the silicon base to be used for one or more n-channel transistor devices (e.g., one or more NMOS devices). As previously described, by selecting the substrate to have the desired material characteristics (e.g., the desired semiconductor material, the desired dopant concentration, and desired dopant type) the substrate can be used to grow multiple different channel layers.

In some embodiments, the techniques described herein can be used to benefit n-channel devices (e.g., NMOS) and/or p-channel devices (e.g., PMOS). Further, in some embodiments, the techniques described herein can be used to benefit MOSFET devices, finFET devices, and/or any other suitable devices as will be apparent in light of this disclosure. Further still, in some embodiments, the techniques described herein can be used to form complementary transistor circuits (such as CMOS circuits), where the techniques can be used to benefit one or more of the included n-channel and p-channel transistors making up the CMOS circuit. Further yet, in some embodiments, the techniques described herein can be used to benefit a multitude of transistor configurations, such as planar and non-planar configurations, where the non-planar configurations may include finned or FinFET configurations (e.g., dual-gate or tri-gate), gate-all-around (GAA) configurations (e.g., nanowire or nanoribbon), or some combination thereof (e.g., beaded-fin configurations), to provide a few examples. In addition, in some embodiments, the techniques can be used for a variety of source/drain (S/D) configurations, such as replacement material S/D, cladded S/D, and/or any other suitable S/D configuration as will be apparent in light of this disclosure. The techniques described herein may be used to benefit logic transistor devices or transistor-based devices used for other suitable applications (e.g., amplification, switching, etc.). Therefore, the techniques described herein can be used to benefit a multitude of transistor devices. In general, the techniques allow transistors to be further scaled with diverse channel materials, while ensuring higher operating voltage, higher drive currents, and thereby improved performance.

Note that, as used herein, the expression "X includes at least one of A or B" refers to an X that may include, for example, just A only, just B only, or both A and B. To this end, an X that includes at least one of A or B is not to be understood as an X that requires each of A and B, unless expressly so stated. For instance, the expression "X includes A and B" refers to an X that expressly includes both A and B. Moreover, this is true for any number of items greater than two, where "at least one of" those items is included in X. For example, as used herein, the expression "X includes at least one of A, B, or C" refers to an X that may include just A only, just B only, just C only, only A and B (and not C), only A and C (and not B), only B and C (and not A), or each of A, B, and C. This is true even if any of A, B, or C happens to include multiple types or variations. To this end, an X that includes at least one of A, B, or C is not to be understood as an X that requires each of A, B, and C, unless expressly so stated. For instance, the expression "X includes A, B, and C" refers to an X that expressly includes each of A, B, and C. Likewise, the expression "X included in at least one of A or B" refers to an X that may be included, for example, in just A only, in just B only, or in both A and B. The above discussion with respect to "X includes at least one of A or B" equally applies here, as will be appreciated.

Use of the techniques and structures provided herein may be detectable using tools such as electron microscopy including scanning/transmission electron microscopy (SEM/TEM), scanning transmission electron microscopy (STEM), nano-beam electron diffraction (NBD or NBED), and reflection electron microscopy (REM); composition mapping; x-ray crystallography or diffraction (XRD); energy-dispersive x-ray spectroscopy (EDX); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. In particular, in some embodiments, such tools may indicate a transistor including a silicon substrate and an indium phosphide channel material. For example, TEM can be useful to show a cross section of the device structure. In another example, x-ray crystallography can be useful to illustrate the crystal quality of the active channel material. In some embodiments, the techniques described herein may be detected based on the benefits derived from their use, which includes channel materials with improved crystal structure, improved carrier mobility, relatively higher operating voltage, relatively higher drive currents, and/or other improved device performance. Numerous configurations and variations will be apparent in light of this disclosure.

Architecture and Methodology

FIG. 1 illustrates method 100 of forming a field effect transistor with improved crystal structure in the active channel layer, in accordance with some embodiments of the present disclosure. FIGS. 2-22 illustrate example IC structures formed when carrying out method 100 of FIG. 1, in accordance with some embodiments of the present disclosure. Note that the techniques and structures described herein are primarily depicted and described in the context of forming finned or FinFET transistor configurations (e.g., tri-gate transistor configurations). However, in some embodiments, the techniques may be used to form transistors of any suitable geometry or configuration as will be apparent in light of this disclosure. Also, note that the techniques for forming the finned structures used in the channel region of one or more transistors may include blanket deposition techniques, replacement fin techniques, and/or any other suitable techniques as will be apparent in light of this disclosure. Further note that method 100 includes a primary path in completion 120 of formation of transistors that illustrates a gate last transistor fabrication process flow (e.g., a replacement gate process flow), which is utilized in some embodiments. However, in other embodiments, a gate first process flow may be used, as will be described herein (and which is illustrated with the alternative gate first flow 120' indicator in FIG. 1). Numerous variations and configurations will be apparent in light of this disclosure.

A multitude of different transistor devices can benefit from the techniques described herein, including, but is not limited to, various field-effect transistors (FETs), such as metal-oxide-semiconductor FETs (MOSFETs), tunnel FETs (TFETs), and Fermi filter FETs (FFFETs) (also known as tunnel source MOSFETs), to name a few examples. For example, the techniques may be used to benefit an n-channel MOSFET (NMOS) device, which may include a source-channel-drain scheme of n-p-n or n-i-n, where 'n' indicates n-type doped semiconductor material, 'p' indicates p-type doped semiconductor material, and 'i' indicates intrinsic/undoped semiconductor material (which may also include nominally undoped semiconductor material, including dopant concentrations of less than 1E16 atoms per cubic centimeter (cm), for example), in accordance with some embodiments. In another example, the techniques may be used to benefit a p-channel MOSFET (PMOS) device, which may include a source-channel-drain scheme of p-n-p or p-i-p, in accordance with some embodiments. In yet another example, the techniques may be used to benefit a TFET device, which may include a source-channel-drain scheme of p-i-n or n-i-p, in accordance with some embodiments. In still another example, the techniques may be used to benefit a FFFET device, which may include a source-channel-drain scheme of np-i-p (or np-n-p) or pn-i-n (or pn-p-n), in accordance with some embodiments.

Figure 17:
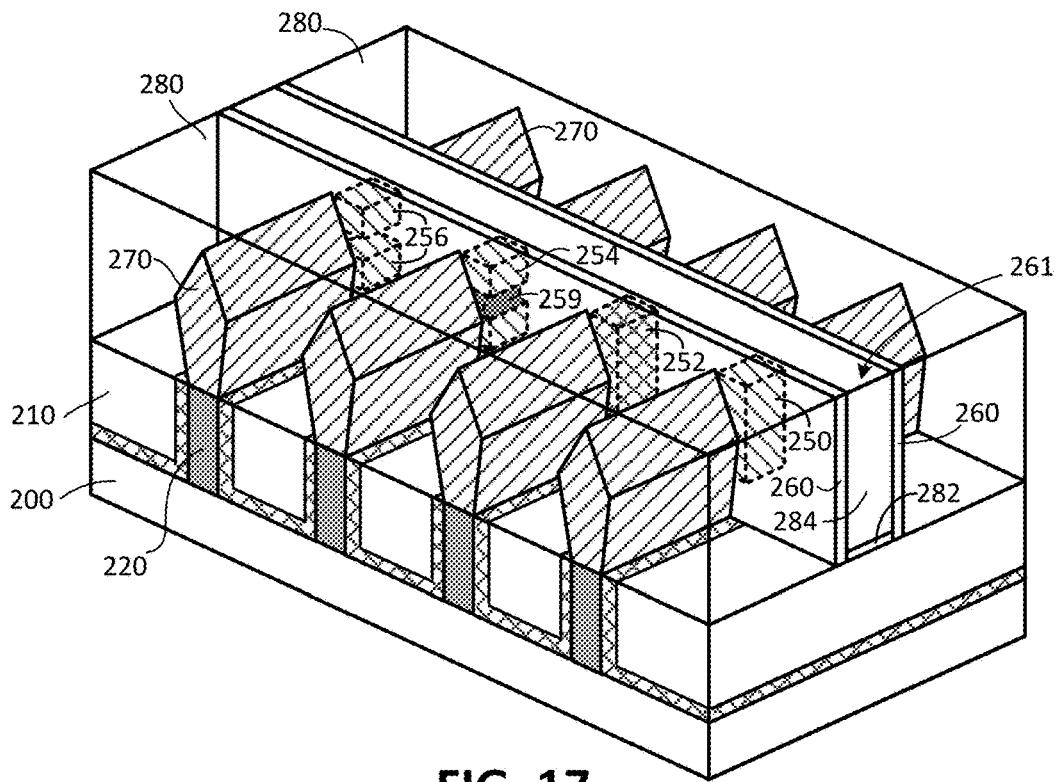
FIG. 17 illustrates the example structure of FIG. 16 after processing a nanowire channel region, a beaded fin region, and a finned channel region in accordance with some embodiments of the present disclosure.

In addition, in some embodiments, the techniques may be used to benefit transistors including a multitude of configurations, such as planar and/or non-planar configurations, where the non-planar configurations may include finned or FinFET configurations (e.g., dual-gate or tri-gate), gate-all-around (GAA) configurations (e.g., nanowire or nanoribbon), or some combination thereof (e.g., a beaded-fin configurations), to provide a few examples. For instance, FIG. 17 illustrates an example IC structure including transistors having finned and nanowire configurations, as will be described in more detail below. Further, techniques of the present disclosure may be used to benefit complementary transistor circuits, such as complementary MOS (CMOS) circuits, where the techniques may be used to benefit one or more of the included n-channel and/or p-channel transistors making up the CMOS circuit. Other example transistor devices that can benefit from the techniques described herein include few to single electron quantum transistor devices, in accordance with some embodiments. Further still, any such devices may employ semiconductor materials that are three-dimensional crystals as well as two dimensional crystals or nanotubes, for example. In some embodiments, the techniques may be used to benefit devices of varying scales, such as IC devices having critical dimensions in the micrometer (micron) range and/or in the nanometer (nm) range (e.g., formed at the 22, 14, 10, 7, 5, or 3 nm process nodes, or beyond).

An aspect of the present disclosure is directed to a method 100 of making a transistor device. FIG. 1 illustrates example processing steps in method 100 in accordance with some embodiments of the present disclosure. Method 100 of FIG. 1 includes providing 102 a semiconductor substrate 200 in accordance with some embodiments. Substrate 200 in some embodiments, may include any suitable material, such as monocrystalline semiconductor material that includes at least one of silicon (Si), germanium (Ge), carbon (C), tin (Sn), phosphorous (P), boron (B), arsenic (As), antimony (Sb), indium (In), and gallium (Ga) to name a few examples.

In some embodiments, the substrate 200 is a bulk silicon wafer, such as monocrystalline silicon. In other embodiments, the substrate 200 can be any suitable semiconductor material, including silicon, silicon carbide (SiC), gallium nitride (GaN), and gallium arsenide (GaAs) to name a few examples. The semiconductor material can be selected in some embodiments from III-V materials and group IV materials. Further, substrate 200 can comprise a semiconductor layer deposited or grown on a base, such as silicon carbide layer epitaxially grown on a sapphire base. In still other embodiments, substrate 200 can be sliced from a boule or other bulk semiconductor material.

Substrate 200, in some embodiments may include a Si on insulator (SOI) structure where an insulator/dielectric material (e.g., an oxide material, such as silicon dioxide) is sandwiched between two Si layers (e.g., in a buried oxide (BOX) structure), or any other suitable starting substrate where the top layer includes Si. In some embodiments, substrate 200 may be doped with any suitable n-type and/or p-type dopant at a dopant concentration in the range of 1E16 to 1E22 atoms per cubic cm, for example. For instance, the Si of substrate 200 may be p-type doped using a suitable acceptor (e.g., boron) or n-type doped using a suitable donor (e.g., phosphorous, arsenic) with a doping concentration of at least 1E16 atoms per cubic cm. However, in some embodiments, substrate 200 may be undoped/intrinsic or relatively minimally doped (such as including a dopant concentration of less than 1E16 atoms per cubic cm), for example. In some embodiments, substrate 200 is referred to as a Si substrate and may consist essentially of Si. In other embodiments, the substrate may primarily include Si but may also include other material (e.g., dopant at a given concentration). Also, note that the substrate 200 may include relatively high quality or device-quality monocrystalline Si or other material that provides a suitable template or seeding surface from which other monocrystalline semiconductor material features and layers can be formed. Therefore, unless otherwise explicitly stated, a Si substrate as described herein is not intended to be limited to a substrate 200 that only includes Si.

In some embodiments, substrate 200 may have a crystalline orientation described by a Miller index of (100), (110), or (111), or its equivalents, as will be apparent in light of this disclosure. Although substrate 200 in this example embodiment is shown for ease of illustration as having a thickness (dimension in the Y-axis direction) similar to that of other layers in the figures, in some instances, substrate 200 may be relatively much thicker than the other layers, such as having a thickness in the range of 1 to 950 microns (or in the sub-range of 20 to 800 microns), for example, or any other suitable thickness or range of thicknesses as will be apparent in light of this disclosure. In some embodiments, substrate 200 may include a multilayer structure including two or more distinct layers that may or may not be compositionally different. In some embodiments, substrate 200 may include grading (e.g., increasing and/or decreasing) of one or more material concentrations throughout at least a portion of the substrate 200. In some embodiments, substrate 200 may be used for one or more other IC devices, such as various diodes (e.g., light-emitting diodes (LEDs) or laser diodes), various transistors (e.g., MOSFETs or TFETs), various capacitors (e.g., MOSCAPs), various microelectromechanical systems (MEMS), various nanoelectromechanical systems (NEMS), various radio frequency (RF) devices, various sensors, or any other suitable semiconductor or IC devices, depending on the end use or target application. Accordingly, in some embodiments, the structures described herein may be included in a system-on-chip (SoC) application, as will be apparent in light of this disclosure.

Method 100 of FIG. 1 continues with forming 104 one or more subfins 220 on the substrate 200 in accordance with some embodiments. In some embodiments, each subfin 220 can be formed using any suitable processing, such as one or more of the aforementioned deposition/epitaxial growth processes (e.g., CVD, PVD, ALD, VPE, MBE, LPE), melt regrowth, and/or any other suitable processing, as can be understood based on this disclosure.

Figure 2:
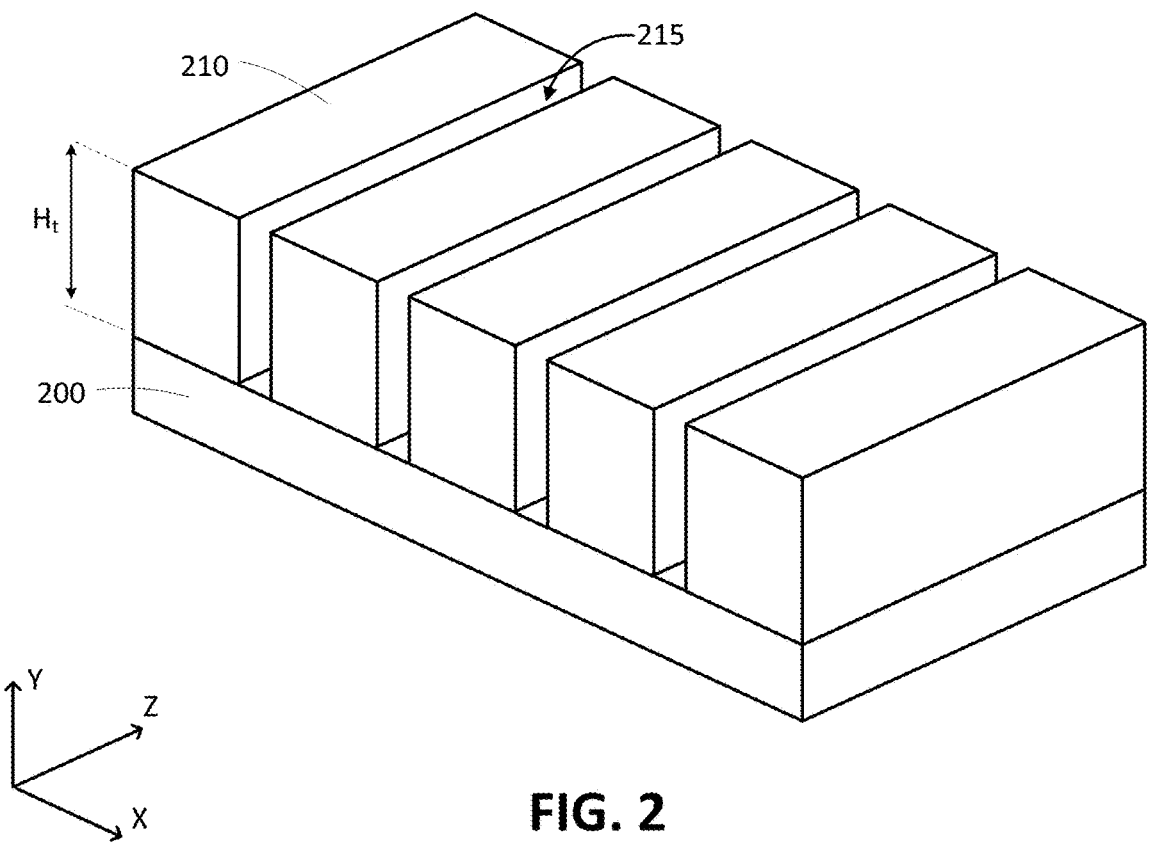
FIG. 2 illustrates an example structure of a substrate with an insulator layer defining trenches extending to the substrate in accordance with some embodiments of the present disclosure.

In one embodiment, for example, each subfin 220 is formed by growth or deposition in a trench 215 formed in an insulating layer 210 on the substrate 200 as shown in the example structure of FIG. 2. In some embodiments, the trench 215 is an aspect ratio trapping trench ("ART trench"). The insulating layer 210 may be, for example, $SiO_2$ formed by thermal oxidation or by deposition using a suitable one of the aforementioned techniques. The insulating layer 210 (e.g., $SiO_2$) is then patterned and etched to define trenches 215. Trenches 215 extend to the substrate 200, or into substrate 200, so that subfins 220 can be formed on the substrate 200 without an intervening oxide or other intervening layer. In some embodiments, trenches 215 have a vertical trench height $H_t$ (e.g., along the Y-axis direction) from 100-800 nm, for example. Other values of vertical trench height $H_t$ are acceptable depending on the desired fin height $H_f$ as discussed in more detail below. Subfin 220 material is then deposited or grown in trenches 215 and optionally planarized as needed (e.g., by chemical mechanical polishing) to arrive at the example structure shown in FIG. 3.

In some embodiments, patterning and etching may be performed using any suitable techniques, including one or more masking, patterning, lithography, and/or etching (e.g., wet and/or dry etching) processes, as can be understood based on this disclosure. For instance, regions of the insulating layer 210 may be masked off, followed by etch processing to define trenches 215 extending to, and optionally into, substrate 200. Note that the depth or vertical height $H_t$ of the etch processing used to form trenches 215 for subfins 220 may vary.

Figure 4:
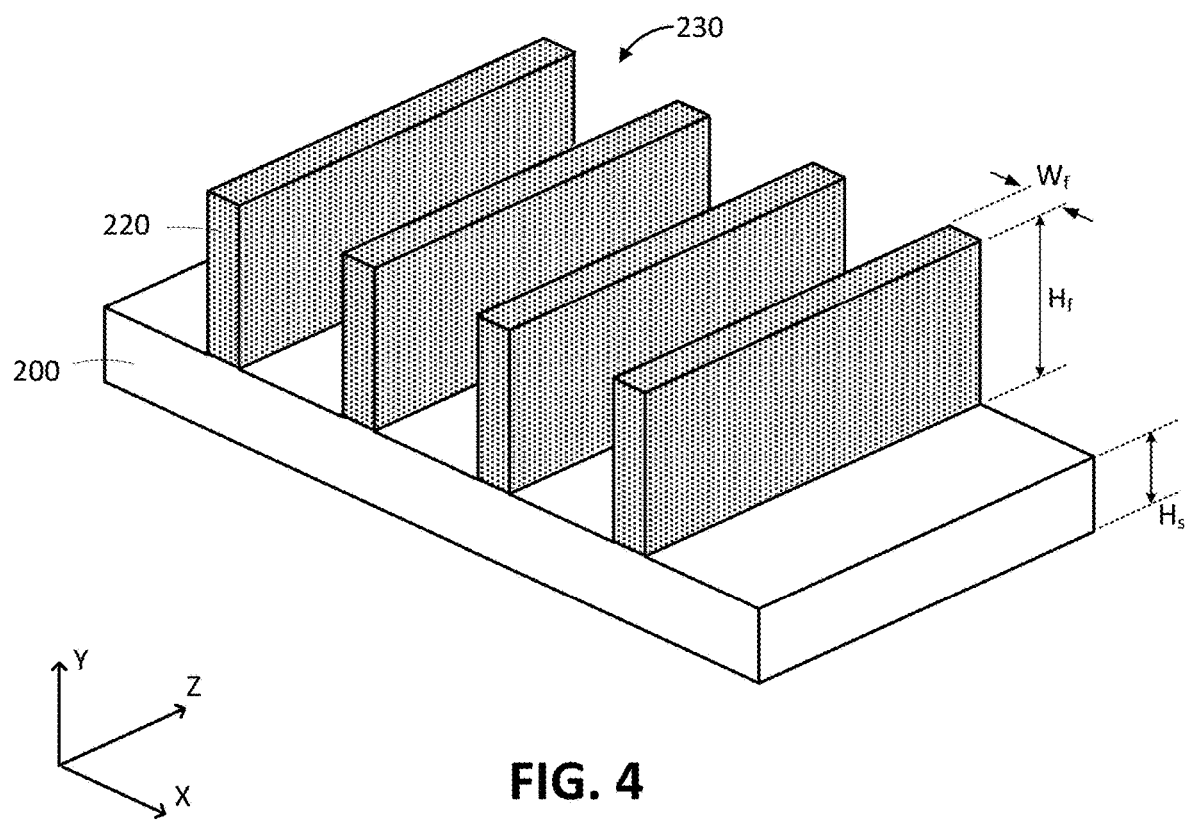
FIG. 4 illustrates the example structure of FIG. 3 with the insulator layer removed to expose fins of subfin material in accordance with some embodiments of the present disclosure.

In other embodiments, a blanket of subfin 220 material is deposited onto substrate 200, followed by masking the regions to be formed into subfins 220 and etching isolation trenches 230 in the remaining material to define subfins 220 as shown, for example, in FIG. 4. Note that such etch processing may be referred to as a shallow trench recess (STR) etch. For instance, the etch processing results in isolation trenches 230 between adjacent subfins 220 that extend all the way down into substrate 200. However, in other embodiments, the etch processing may go farther down (e.g., such that isolation trenches 230 may extend deeper into substrate 200).

Figure 3:
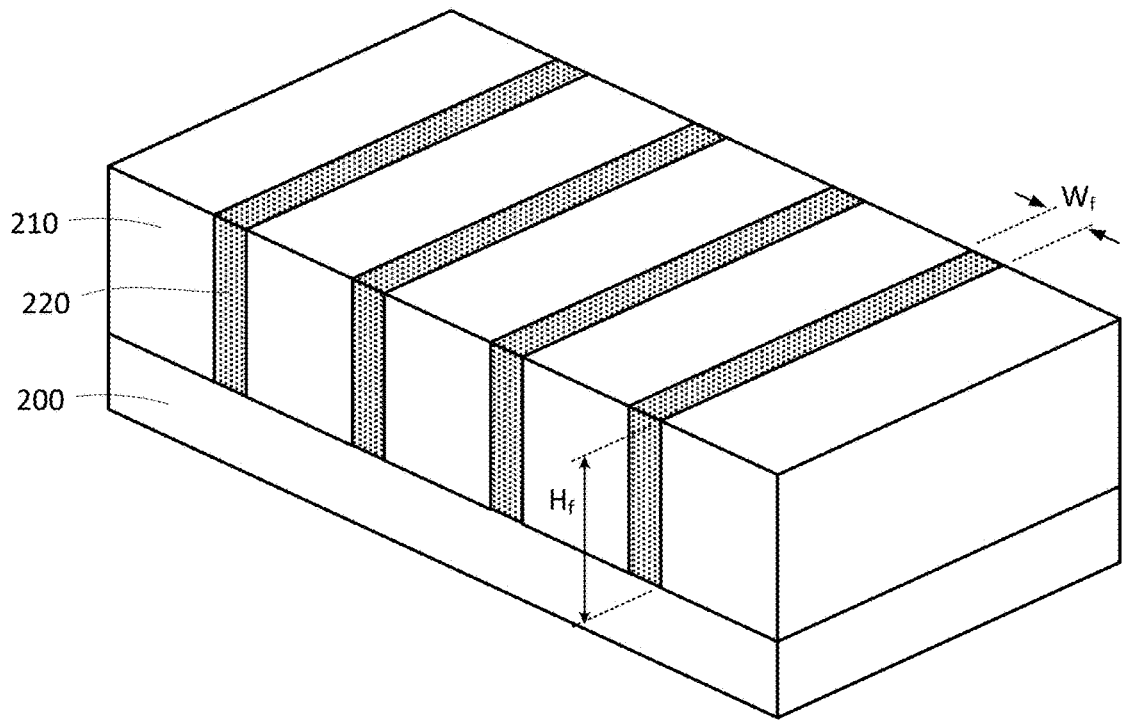
FIG. 3 illustrates the example structure of FIG. 2 with a subfin material formed in the trenches in accordance with some embodiments of the present disclosure.

In some embodiments, depending on subsequent processing to be performed, insulating layer 210 (e.g., $SiO_2$ or $Si_3N_4$) can be deposited or grown on the example structure of FIG. 4 if needed, optionally followed by planarization to result in the example structure as shown in FIG. 3. Alternately, the example structure of FIG. 4 can proceed to forming 110 a cladding layer as discussed below.

In yet other embodiments, forming 104 subfins 220 on the substrate 220 may include an alternative replacement fin-based approach in accordance with some embodiments. As can be understood based on this disclosure, the replacement fin-based approach includes forming fins in the substrate 200, forming shallow trench isolation (STI) material around those fins, recessing the native-to-substrate fins to define fin-shaped trenches 215, and then forming subfins 220 in the fin-shaped trenches 215. The replacement fin approach continues with forming 107 insulating material 210 between the subfins 220 to form the example resulting structure of FIG. 3.

In some embodiments, subfin 220 material is a III-V semiconductor, such as GaAs, InGaAs, AlGaAs, or AlAs, to name a few examples. In some embodiments, subfin 220 material may or may not be doped with a suitable dopant (e.g., boron, phosphorous, and/or arsenic). In embodiments where the subfin 220 material is doped, it may be n-type doped (e.g., with phosphorous or arsenic) or p-type doped (e.g., with boron) at a dopant concentration in the range of 1E16 to 1E22 atoms per cubic cm, for example. In some embodiments, subfins 220 may have a multilayer structure including two or more distinct layers (that may or may not be compositionally different). In some embodiments, subfins 220 may include grading (e.g., increasing and/or decreasing) of one or more material concentrations throughout at least a portion of the subfin 220 material.

In some embodiments, each subfin 220 may include a vertical fin height $H_f$ (dimension in the Y-axis direction) in the range of 20-500 nm (or in a subrange of 20-50, 20-100, 20-200, 20-300, 20-400, 50-100, 50-200, 50-300, 50-400, 50-500, 100-250, 100-400, 100-500, 200-400, or 200-500 nm) and/or a maximum vertical fin height $H_f$ of at most 500, 450, 400, 350, 300, 250, 200, 150, 100, or 50 nm, for example. In some embodiments, each subfin 220 may include a horizontal fin width $W_f$ (dimension in the X-axis direction) in the range of 5-100 nm (or in a subrange of 5-10, 5-20, 5-30, 5-50, 5-80, 5-100, 10-20, 10-30, 10-50, 10-80, 10-100, 20-30, 20-50, 20-80, 20-100, 30-50, 30-80, 30-100, or 50-80, 50-100, or 80-100 nm) and/or a maximum horizontal fin width $W_f$ of at most 100, 80, 50, 30, 20, or 10 nm, for example. Other suitable materials and thickness values/ranges/thresholds will be apparent in light of this disclosure.

Note that although each subfin 220 shown in FIGS. 3 and 4 (of which there are four shown in each figure) are illustrated as having the same sizes and shapes relative to one another; however, the present disclosure is not intended to be so limited. For example, in some embodiments, the subfins 220 may be formed to have varying fin heights $H_f$ and/or varying fin widths $W_f$ that may correspond to (or be the same as) the final desired fin heights $H_f$ and fin widths $W_f$ described in more detail below. For instance, in some embodiments, a given fin width $W_f$ (dimension in the X-axis direction) may be in the range of 2 nm-400 nm (or in a subrange of 2-10, 2-20, 2-50, 2-100, 2-200, 4-10, 4-20, 4-50, 4-100, 4-200, 4-400, 10-20, 10-50, 10-100, 10-200, 10-400, 50-100, 50-200, 50-400, or 100-400 nm), for example, or any other suitable value or range as will be apparent in light of this disclosure. Further, in some embodiments, a given fin height $H_f$ (dimension in the Y-axis direction) may be in the range of 4 nm-800 nm (or in a subrange of 4-10, 4-20, 4-50, 4-100, 4-200, 4-400, 10-20, 10-50, 10-100, 10-200, 10-400, 10-800, 50-100, 50-200, 50-400, 50-800, 100-400, 100-800, or 400-800 nm), for example, or any other suitable value or range as will be apparent in light of this disclosure. In some embodiments, the fin height $H_f$ may be at least 25, 50, 75, 100, 125, 150, 175, 200, 300, 400, 500, 600, 700, or 800 nm tall, or greater than any other suitable threshold fin height $H_f$ as will be apparent in light of this disclosure. In some embodiments, the ratio of fin height to fin width ($H_f$:$W_f$) may be greater than 1, such as greater than 1.5, 2, 2.5, 3, 3.5, 4, 4.5, 5, 6, 7, 8, 9, or 10, or greater than any other suitable threshold ratio, as will be apparent in light of this disclosure. As previously stated, although the subfins 220 in FIG. 4 are shown as having the same heights $H_f$ and fin widths $W_f$, the subfins 220 may be formed to have varying fin heights $H_f$, varying fin widths $W_f$, varying vertical starting points (location in the Y-axis direction), varying shapes, and/or any other suitable variation(s) as will be apparent in light of this disclosure.

Similarly, trenches 215 may be formed to have varying depths or trench height $H_t$, varying trench widths, varying vertical starting points (location in the Y-axis direction), varying shapes, and/or any other suitable variation(s) as will be apparent in light of this disclosure. Although four subfins 220 are shown in the example structures of FIGS. 3-4 for ease of illustration, any number of subfins 220 may be formed, such as one, two, three, five, ten, hundreds, thousands, millions, and so forth, as can be understood based on this disclosure. Also, note that the subfins 220 are shown for ease of illustration in FIGS. 3-4 as having a fin height $H_f$ that is relatively greater than the substrate thickness $H_s$ (dimension in the Y-axis direction) of substrate 200. However, in some embodiments, the fin height $H_f$ may be relatively much less than (e.g., ½ to 1/10 or a smaller fraction of) the substrate thickness $H_s$ of substrate 200, for example.

In some embodiments, the subfin 220 material may be included in part of the channel region 255 of one or more transistor 295. In some such embodiments, a portion of each subfin 220 may make up a portion of a given device's channel region 255, where subsequently formed channel layer 250 material makes up the rest of the channel region 255, for example. In still other embodiments, the subfin 220 may be completely below the channel region 255 of a given transistor 295 where it is completely contained in a sub-channel or sub-fin region, for example. In some such embodiments, the subfin 220 can be used as a template or a seeding layer from which to form various different channel layers 250, as will be described in more detail below. Further, in some such embodiments, the subfin 220 material may be oppositely type doped relative to the overlying channel layer 250 material to provide a tunnel diode configuration to help reduce or eliminate parasitic leakage (e.g., subthreshold leakage). For instance, in some embodiments, the subfin 220 material may be intentionally p-type doped (e.g., with a doping concentration of at least 1E16, 5E16, 1E17, 5E17, 1E18, 5E18, or 1E19 atoms per cubic cm) if the overlying channel layer 250 material is to be n-type doped, or vice versa, where the subfin 220 material may be intentionally n-type doped (e.g., with a doping concentration of at least 1E16, 5E16, 1E17, 5E17, 1E18, 5E18, or 1E19 atoms per cubic cm) if the overlying channel layer 250 material is to be p-type doped.

Method 100 of FIG. 1 continues with forming 106 a lined trench 217 in accordance with some embodiments of the present disclosure. These processes are discussed in more detail below and include various embodiments of forming 106 a lined trench 217. As shown in FIG. 1, forming 106 the lined trench 217 may begin with any one of processes 107, 108, 109, or 110, depending on processing performed to form 104 subfins 220 on the substrate 200 as discussed above. Two groups of example embodiments of forming 106 a lined trench 217 are discussed below. One group of embodiments of forming 106 a lined trench 217 will be discussed first and includes processes 108, 110, and 112. A second group of embodiments of forming 106 a lined trench 217 will be discussed second and includes processes 107, 109, 111, and 113. Discussion of additional processes 114, 116, 120 will follow.

Figure 7:
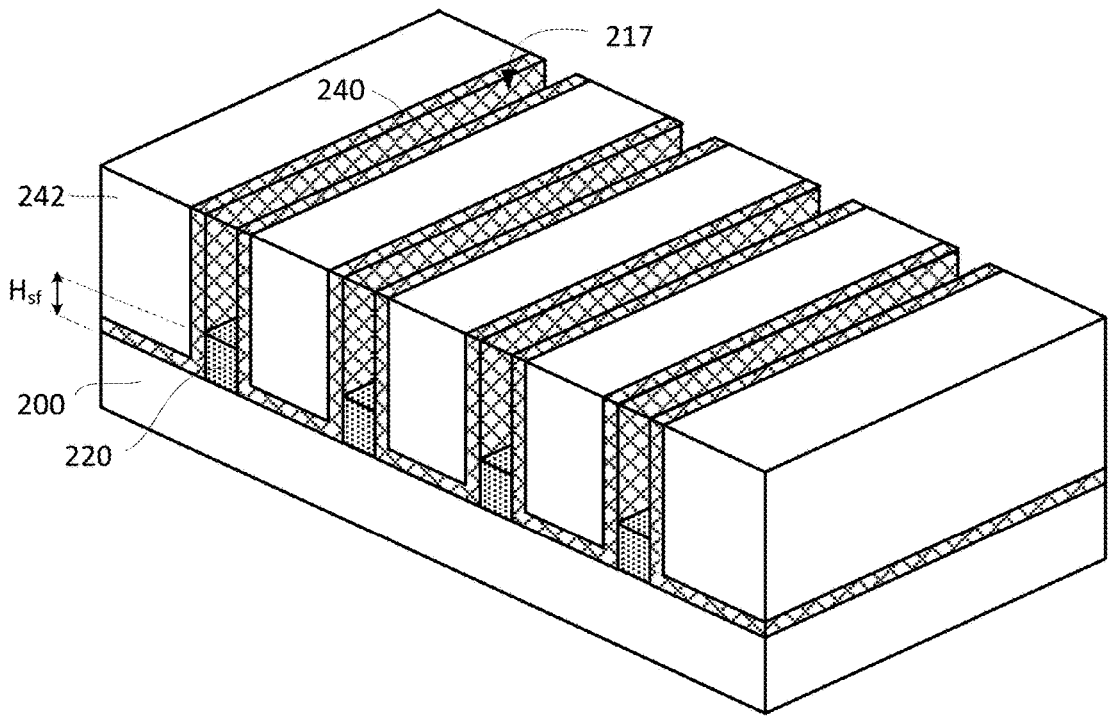
FIG. 7 illustrates the example structure of FIG. 6 after recessing the subfin material to define lined trenches extending up from the recessed subfin material in accordance with some embodiments of the present disclosure.

In one embodiment, forming 106 a lined trench 217 includes removing 108 the insulating layer 210 to expose the fins, forming 110 a cladding layer or liner 240 on the exposed fins, planarizing with fill and polishing as needed, and recessing the subfin 220 material into the trench 215 to result in a lined trench 217 extending up from each subfin 220 as shown in the example structure of FIG. 7. The insulating layer 210 (e.g., $SiO_2$, $Si_3N_4$ or other insulator) is removed 108 to result in subfins 220 extending up (e.g., in the Y-axis direction) from the substrate 220 in a fin shape, where adjacent subfins 220 are spaced apart (e.g., in the X-axis direction) by isolation trenches 230 as shown, for example, in FIG. 4. Any suitable technique may be used to remove the insulating layer 210, including chemical etch and reactive ion etch as examples.

If present, insulating layer 210 is removed 108 to arrive at the example structure shown in FIG. 4. For example, where insulating layer 210 is $SiO_2$, the layer is removed 108 by a suitable wet or dry etching method.

Figure 5:
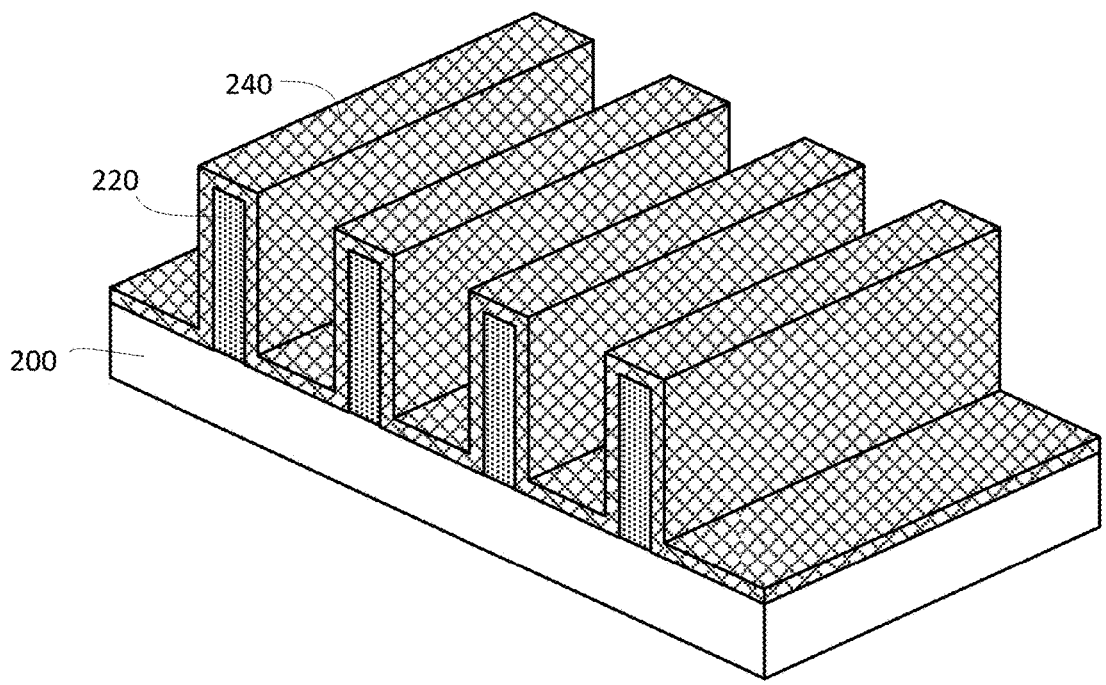
FIG. 5 illustrates the example structure of FIG. 4 showing a liner material layer disposed as a cladding layer over the subfin material and substrate in accordance with some embodiments of the present disclosure.
Figure 6:
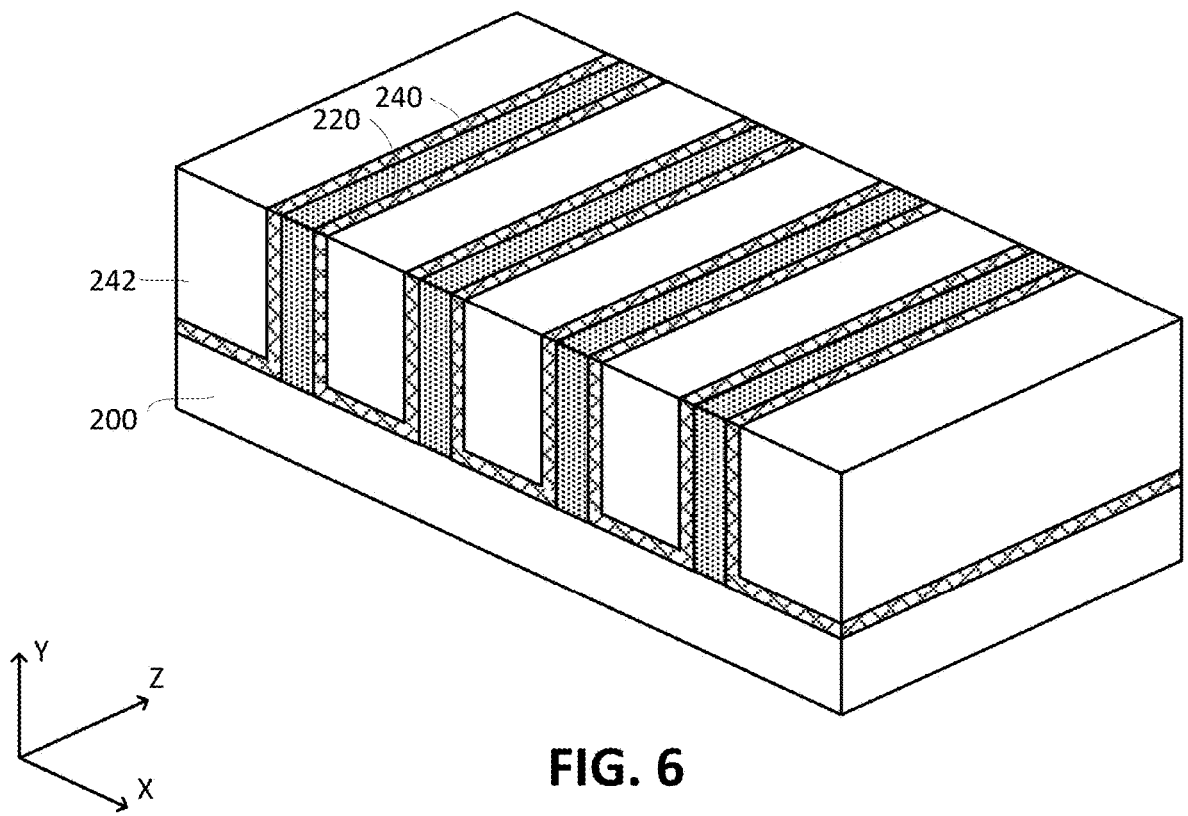
FIG. 6 illustrates the example structure of FIG. 5 after forming an insulating layer over the liner material and planarizing to expose top surfaces of each fin of subfin material in accordance with some embodiments of the present disclosure.

A layer of liner 240 material is formed 110 as a cladding layer on the subfins 220 and substrate 200 to result in the example structure as shown in FIG. 5. In some embodiments, the liner 240 material is selected to have a lattice constant mismatch with channel layer 250 material of 4% or less. In one embodiment, liner 240 material is indium gallium arsenide (InGaAs). In one embodiment, the liner 240 material is $In_{0.53}Ga_{0.47}As$, which is lattice matched to indium phosphide (InP) selected for channel layer 250 material. A liner insulating layer 242 (e.g., $SiO_2$ or dielectric) is then deposited on liner 240, optionally followed by planarization to result in the example structure shown in FIG. 6. Planarization may be performed by CMP or other suitable method. In some embodiments, liner material 240 has a thickness from 1 nm to 5 nm. In other embodiments, liner material 240 has a thickness of 5-10 nm or greater.

The subfin 220 material is then recessed 112 in the trench 215 to a desired vertical subfin height $H_{sf}$ (e.g., in the Y-axis direction), thereby resulting in a lined trench 217 extending up from each subfin 220 as shown, for example, in FIG. 7. The lined trench 217 is partially filled with subfin 220 material and has sidewalls extending vertically above the subfin 220 that are lined with the liner 240 material. Recessing 112 the subfin 220 material may be performed by a selective chemical etch. In one embodiment, where the subfin 220 material is GaAs, an ammonium hydroxide/peroxide solution is used to recess the GaAs subfins 220 to the desired subfin height $H_{sf}$. In other embodiments, a chemical etchant is selected to remove the subfin 220 material while leaving substantially intact other materials. In some embodiments, each recessed subfin 220 has a vertical subfin height $H_{sf}$ from 20-200 nm. Other values of the subfin height $H_{sf}$ are acceptable, including 20 nm, 40 nm, 50 nm, 60 nm, 80 nm, 100 nm, 120 nm, 140 nm 160 nm 180 nm, 200 nm, 250 nm, 300 nm, 350 nm, and 400 nm.

Figure 8:
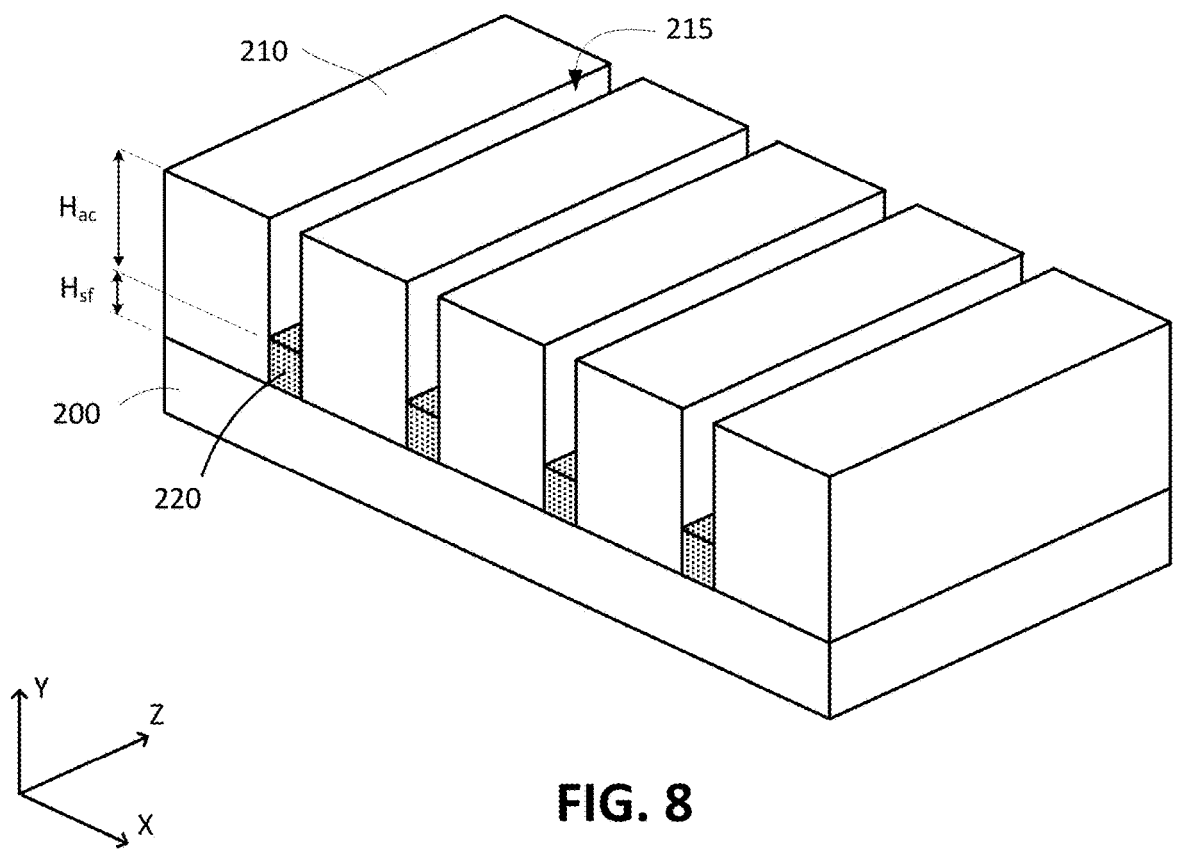
FIG. 8 illustrates the example structure of FIG. 2 after forming subfin material in the lower portion of each trench in accordance with certain other embodiments of the present disclosure.
Figure 9:
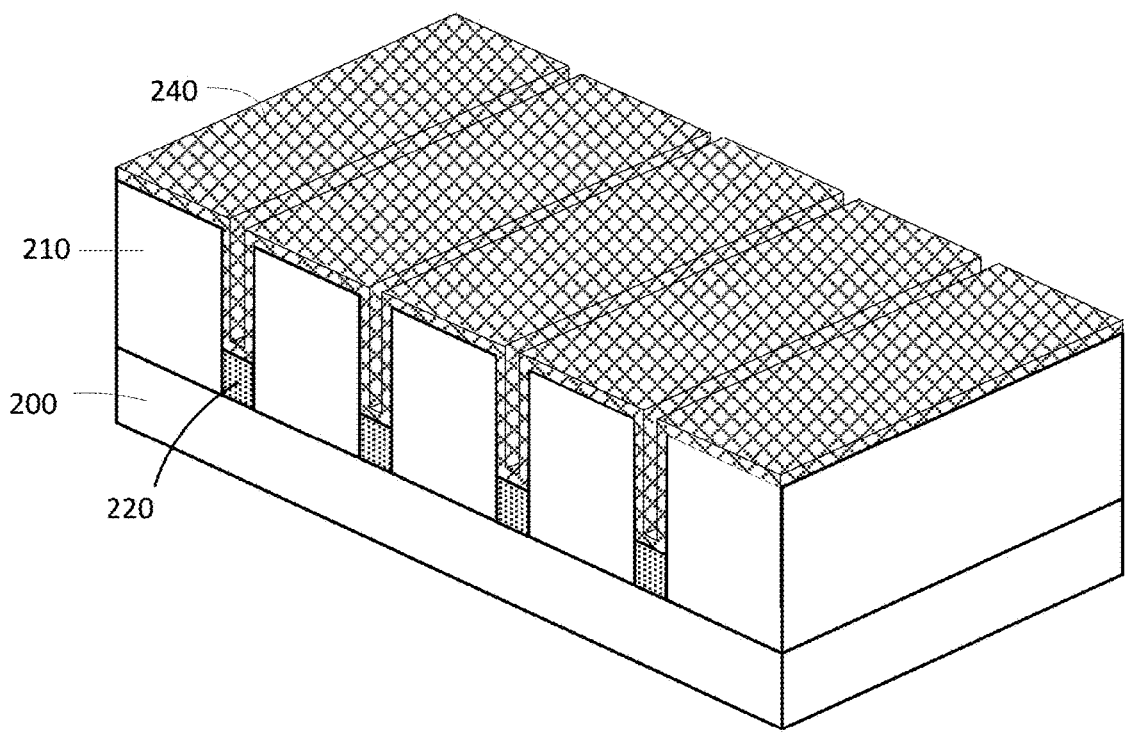
FIG. 9 illustrates the example structure of FIG. 8 after forming a layer of liner material over the insulator layer, trench sidewalls, and top surface of each subfin in accordance with some such embodiments of the present disclosure.
Figure 10:
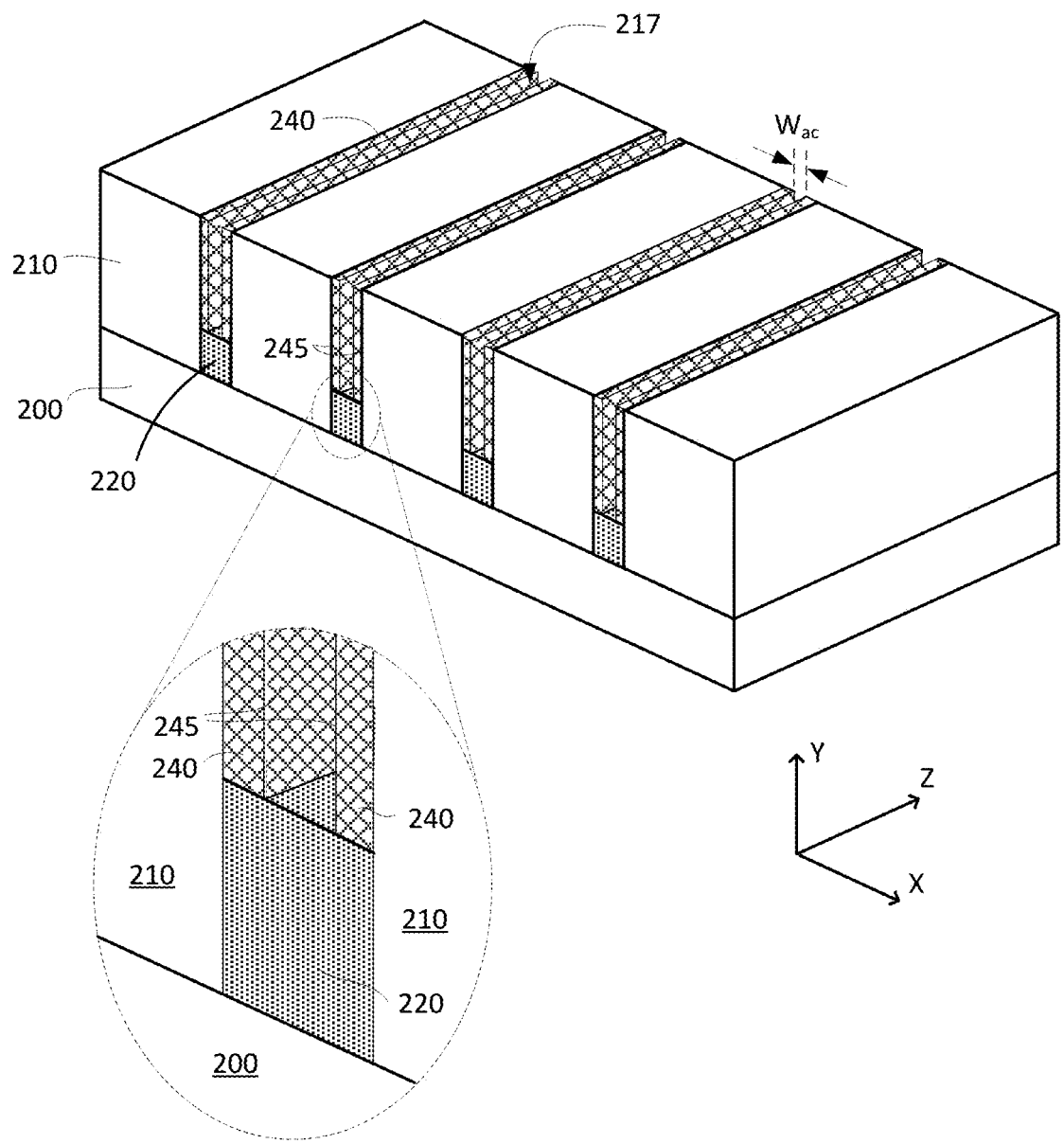
FIG. 10 illustrates the example structure of FIG. 9 after performing an anisotropic etch to remove the liner material from the top surface of the subfin material and insulator layer, resulting in a lined trench extending up from each subfin in accordance with some such embodiments of the present disclosure.
Figure 11:
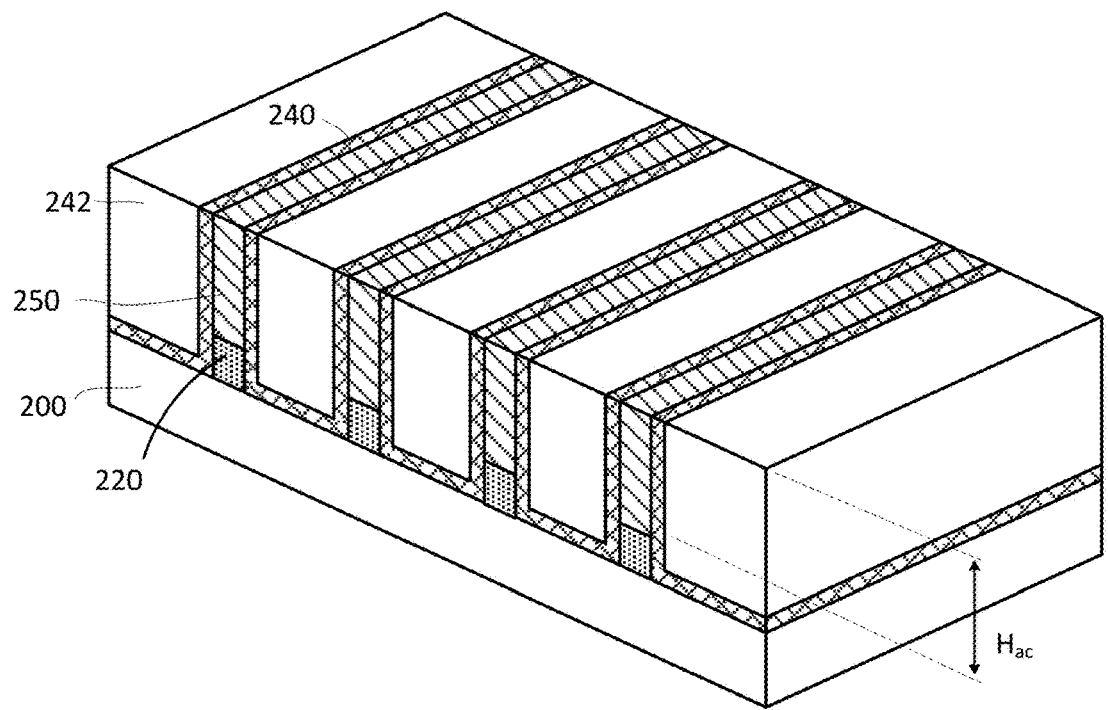
FIG. 11 illustrates the example structure of FIG. 7 after forming channel material in the lined trenches in accordance with some such embodiments of the present disclosure.
Figure 12:
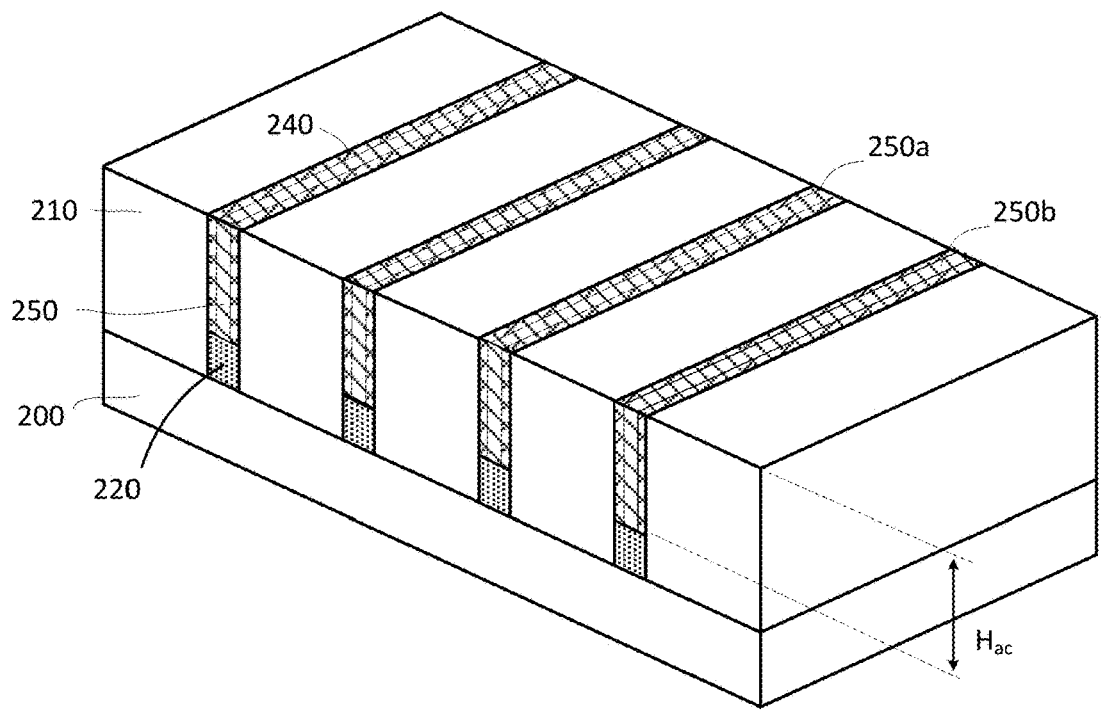
FIG. 12 illustrates the example structure of FIG. 10 after forming channel material in the lined trenches in accordance with some such embodiments of the present disclosure.

Referring now to FIGS. 8-10 and continued reference to FIG. 3, another group of embodiments of forming 106 lined trench 217 is discussed. If an insulating layer 210 is not present, process 106 starts with forming an insulating layer 210 between subfins 220, followed optionally by planarizing to arrive at the example structure of FIG. 3. Relevant processes discussed above for forming 104 subfins 220 and insulating layer 210 on the substrate 200 are applicable here.

From the example structure shown in FIG. 3, process 106 continues with recessing 109 the subfin 220 material in trench 215 to a reduced vertical subfin height $H_{sf}$ as shown, for example, in FIG. 8. In one embodiment, the subfin 220 material is recessed 109 to a subfin height $H_{sf}$ that defines the active channel fin height $H_{ac}$ based on the remaining available trench height $H_t$ (shown in FIG. 2). Recessing 109 subfin 220 may be performed using any suitable process, such as using an ammonium hydroxide/peroxide solution to selectively recess subfins 220 of GaAs. For example, the subfin 220 is recessed 109 to provide an active channel fin height $H_{ac}$ from 4 nm-800 nm. As similarly discussed above for fin height $H_f$, in some embodiments, a given active fin height $H_{ac}$ (dimension in the Y-axis direction) may be in the range 4 nm-800 nm (or in a subrange of 4-10, 4-20, 4-50, 4-100, 4-200, 4-400, 10-20, 10-50, 10-100, 10-200, 10-400, 10-800, 50-100, 50-200, 50-400, 50-800, 100-400, 100-800, or 400-800 nm), for example, or any other suitable value or range as will be apparent in light of this disclosure.

A layer of liner 240 material is deposited 111 conformably on the insulating layer 210, subfins 220, and sidewalls of the trench 215. In this embodiment, the liner 240 material is a non-$SiO_2$ dielectric material selected to provide a lattice constant or other physical properties that facilitate growth of the channel layer 250 material with reduced or virtually no defects, such as virtually no stacking faults emanating from the interface between liner 240 and channel layer 250. In some embodiments, when examined using transmission electron microscopy (TEM), the channel layer 250 material exhibits virtually no stacking faults in accordance with an embodiment of the present disclosure. Stated differently, channel layer 250 has fewer than 1E6 defects per $cm^2$. In one embodiment, the dielectric material of liner 240 is silicon nitride ($Si_xN_y$, including $Si_3N_4$), aluminum oxide ($Al_2O_3$), hafnium oxide ($HfO_2$), or titanium dioxide ($TiO_2$). Liner 240 may be deposited using an ALD process. In some embodiments, the liner 240 of dielectric material has a thickness from 1-10 nm. For example, when the trench 215 has a width of 10-15 nm, the liner 240 may be deposited 111 to have a thickness of 1-5 nm, or about 2 nm. The resulting channel width $W_{ac}$ (e.g., in a direction along the X-axis) of the lined trench 217 would therefore be from about 6-11 nm as shown, for example, in FIG. 10.

After depositing 111 the liner 250 material, an anisotropic etch 113 is performed to remove the liner 240 of dielectric material from the top surface of the insulating layer 210 and from the subfin 220 material to provide the example structure shown in FIG. 10. The result is a lined trench 217 with sidewalls 245 extending vertically up from the subfin 220 and having sidewalls 245 lined with the liner 240 of dielectric material, such as shown in the enlarged breakout view in FIG. 10. An advantage of processes 109, 111, 113 is that the lined trench 217 has a reduced channel width $W_{ac}$ (e.g., in the X-axis direction) compared to that resulting from processes 108, 110, 112 discussed above. In one embodiment, the lined trench 217 has a channel width $W_{ac}$ from 6-10 nm, such as 7-8 nm.

Method 100 of FIG. 1 continues with forming 114 one or more channel layers 250 in the lined trench 217, in accordance with some embodiments. In some embodiments, process 114 may be performed, such as forming channel layer 250 on each subfin 220 to result in the example structures shown in FIG. 11 (resulting from processes 108-112) or FIG. 12 (resulting from processes 107-113). In some embodiments, channel layer 250 may be formed 114 using any suitable processes, such as one of the aforementioned techniques (e.g., CVD, PVD, ALD, VPE, MBE, LPE, melt regrowth) and/or any other suitable processing. In some embodiments, channel layer 250 material may include any suitable semiconductor material, such as monocrystalline group IV and/or group III-V semiconductor material, for example.

In embodiments, channel layer 250 material is selected to be lattice matched or have a lattice mismatch of 4% or less with respect to liner 240 material. In other embodiments, channel layer 250 material has a lattice mismatch of at most 2%, at most 3%, at most 5%, at most 6%, at most 7%, at most 8%, at most 9% or at most 10% with respect to liner 240 material. As discussed above, liner 240 material may be a group III-V semiconductor or non-SiO$_2$ dielectric. As such, channel layer 250 material and the liner 240 material are generally selected as a pair of materials having the desired lattice match or other physical properties that result in the desired crystal quality of channel layer 250. In some embodiments, channel layer 250 has virtually no defects, such as being free of stacking faults emanating from sidewall 245. In other embodiments, channel layer 250 has no more than 1E6 stacking faults per cm$^2$, the resolution of transmission electron microscopy. In some embodiments, channel layer 250 has a carrier mobility of at least 300 cm$^2$/Vs, at least 400 cm$^2$/Vs, at least 500 cm$^2$/Vs, at least 600 cm$^2$/Vs, at least 700 cm$^2$/Vs, or at least 1000 cm$^2$/Vs.

Recall that the use of the term "group IV semiconductor material" (or "group IV material" or generally, "IV") herein includes at least one group IV element (e.g., silicon, germanium, carbon, tin), such as silicon (Si), germanium (Ge), silicon germanium (SiGe), and so forth. Also recall that the use of the term "group III-V semiconductor material" (or "group III-V material" or generally, "III-V") herein includes at least one group III element (e.g., aluminum, gallium, indium) and at least one group V element (e.g., nitrogen, phosphorus, arsenic, antimony, bismuth), such as gallium arsenide (GaAs), indium gallium arsenide (InGaAs), indium aluminum arsenide (InAlAs), gallium phosphide (GaP), gallium antimonide (GaSb), indium phosphide (InP), and so forth. Note that group III may also be known as the boron group or IUPAC group 13, group IV may also be known as the carbon group or IUPAC group 14, and group V may also be known as the nitrogen family or IUPAC group 15, for example.

In embodiments, channel layer 250 is indium phosphide (InP) grown in lined trench 217 with sidewalls 245 lined with InGaAs, other III-V material, SiN, Al$_2$O$_3$, HfO$_2$, or TiO$_2$ as in processes discussed above. In such embodiments, channel layer 250 of indium phosphide can be grown consistently to exhibit virtually no defects when analyzed using TEM or x-ray spectroscopy. In some embodiments, channel layer 250 material may include at least one of silicon, germanium, gallium, arsenide, indium, and/or aluminum. In some embodiments, channel layer 250 material may be doped (e.g., with any suitable n-type or p-type dopant) at a dopant concentration in the range of 1E16 to 1E22 atoms per cubic cm, for example. For example, in the case of group IV semiconductor materials, the group IV material may be p-type doped using a suitable acceptor (e.g., boron) or n-type doped using a suitable donor (e.g., phosphorous, arsenic). In another example, in the case of group III-V semiconductor material, the group III-V material may be p-type doped using a suitable acceptor (e.g., beryllium, zinc) or n-type doped using a suitable donor (e.g., silicon). In other embodiments, the channel layer 250 material may be intrinsic/undoped (or nominally undoped, with a dopant concentration less than 1E16 atoms per cubic cm), depending on the particular configuration.

In some embodiments, channel layer 250 has a fin width $W_f$ that is less than a fin width $W_f$ of subfin 220. For example, by forming liner 240 on sidewalls 245 as discussed above for processes 107-113 and 114 and shown in FIGS. 12 & 14, channel layer 250 may have a fin width $W_f$ that is approximately 50-80% of the fin width $W_f$ of subfin 220. In one example, channel layer 250 has a fin width $W_f$ of 7-8 nm and subfin has a fin width $W_f$ of 10-12 nm. In other embodiments, channel layer 250 has a fin width $W_f$ that is equal to that of subfin 220, such as resulting from processes 108-112 and 114 discussed above and shown in FIGS. 11 & 13. A reduced fin width $W_f$ has the advantage of having improved electrostatic control and is easier to turn off the transistor.

Further, in some embodiments, a sacrificial channel layer may be formed at this stage of the processing, where the sacrificial channel layer material may be later removed and replaced with final channel layer 250 material. Such a sacrificial channel layer or part thereof may be employed in embodiments where multiple channel layers are formed, for example. In one example, a sacrificial channel layer is used in the formation of nanowires or nanoribbons.

In some embodiments, channel layer 250 may include a multilayer structure that includes two or more distinct layers (that may or may not be compositionally different). In some such embodiments, channel layer 250 may be formed using a layer-by-layer epitaxial growth approach (e.g., using an MBE process), such that the channel layer 250 may or may not appear to have distinct interfaces within the layer, depending on the particular configuration and observation level. In embodiments where a nanowire (or nanoribbon or GAA) transistor is to be formed from the channel layer 250 material, it may include at least one channel layer 250 and at least one sacrificial layer to be removed to release the channel layer 250 to enable forming that nanowire transistor, as will be described in more detail below with reference to FIG. 17. For instance, in an example embodiment, a given channel layer 250 may include alternating layers of group IV and group III-V semiconductor material, where either the group IV or group III-V material is sacrificial, to enable the formation of one or more nanowires, where the sacrificial material is subsequently removed, such as during replacement gate processing. In some embodiments, channel layer 250 may include grading (e.g., increasing and/or decreasing) the concentration of one or more materials within the feature, such as the grading of a semiconductor material component concentration and/or the grading of the dopant concentration, for example. For instance, the grading may occur as the material of channel layer 250 is epitaxially grown (e.g., in the Y-axis direction). In some embodiments, a given channel layer 250 may include a vertical active channel height $H_{ac}$ (dimension in the Y-axis direction) in the range of 20-500 nm (or in a subrange of 20-50, 20-100, 20-200, 20-300, 20-400, 50-100, 50-200, 50-300, 50-400, 50-500, 100-250, 100-400, 100-500, 200-400, or 200-500 nm) and/or a maximum vertical thickness of at most 500, 450, 400, 350, 300, 250, 200, 150, 100, or 50 nm, for example. Other suitable materials and thickness values/ranges/thresholds will be apparent in light of this disclosure.

In some embodiments, multiple different channel layer 250 materials may be formed on different areas of the substrate 200, such as for CMOS applications, for example. For instance, a first channel layer 250a material may be formed on a first area of the substrate 200 to be used for one or more p-channel transistor devices (e.g., one or more PMOS devices) and a second channel layer 250b material may be formed on a second area of the substrate 200 to be used for one or more n-channel transistor devices (e.g., one or more NMOS devices). By selecting the subfin 220 material and/or liner 240 material to have the desired properties, multiple different channel layers 250 can be grown. For instance, in some such embodiments, the first channel layer 250a material may include a n-type group III-V or group IV material and a second channel layer 250b material may include a p-type group III-V or group IV material.

In some embodiments employing multiple different channel layer 250 materials, the first channel layer material may include group IV semiconductor material (e.g., Si, SiGe, Ge, etc.) and the second channel layer material may include group III-V semiconductor material (e.g., GaAs, InGaAs, InP, etc.). Recall that, in general, a given channel layer 250 may include monocrystalline group IV semiconductor material and/or group III-V semiconductor material. For instance, in a beaded-fin transistor configuration, the channel region may include both group IV semiconductor material (e.g., for the broader or narrower portions) and group III-V semiconductor material (e.g., for the other of the broader or narrower portions). Note that the multiple different channel layers 250 may be formed using any suitable techniques, such as masking, depositing, and removing the masking as desired to form any number of compositionally different channel layers 250. Further note that forming channel layers 250 of multiple different materials may include 2-5 or more compositionally different layers formed in the lined ART trench 217, in accordance with some embodiments. Where employed, numerous different channel layer 250 configurations and variations will be apparent in light of this disclosure.

Method 100 of FIG. 1 continues with recessing 116 the liner 140 material and insulating material, such as insulating layer 210 or liner insulating layer 242. After forming the channel layer 250 in the lined trench 217, the channel layer 250 extends vertically upward in a fin shape from subfin 220, and has sidewalls surrounded by liner 240. Recessing the liner 140 and insulating material (e.g., insulating layer 210 or liner insulating layer 242) may be performed by any suitable techniques, including one or more of masking, patterning, lithography, and/or etching (e.g., wet and/or dry etching) processes, as can be understood based on this disclosure. In some embodiments, for example, a highly anisotropic fluorine-based plasma etch is used. In embodiments, liner 140 and insulating layer 210, 242 are recessed to a level at or above the interface between subfin 220 and channel layer 250. In other embodiments, liner 140 and insulating layer 210, 242 are recessed to a level below the interface between subfin 220 and channel layer 250, where the active channel 255 includes all or part of subfin 220.

Turning now to FIGS. 15-18, method 100 of FIG. 1 continues with completing 120 the transistor 295. For example, completing 120 the transistor 295 begins from the example structure shown in FIG. 13 or FIG. 14, where the channel layer 250 is exposed after recessing 116 the liner 140 and insulating layer 102 or after recessing the liner 140 and liner insulating layer 242, respectively. Completing 120 the transistor may begin with forming 122 the dummy gate stack 261 or final gate stack 261 in accordance with some embodiments. As previously described, a gate last fabrication process may utilize a dummy gate stack to allow for replacement gate processing, while a gate first fabrication process may form the final gate stack in the first instance. Continuing from the example structure of FIG. 13 or FIG. 14, the processing is primarily described herein in the context of a gate last transistor fabrication flow, where the processing includes forming a dummy gate stack 261, performing the S/D processing, and then forming the final gate stack 261 after the S/D regions have been processed. In other embodiments, the techniques may be performed using a gate first process flow. In such example embodiments, a dummy gate stack 261 need not be formed, as the final gate stack 261 can be formed in the first instance. However, the description of the continued processing will be described using a gate last process flow, to allow for such a gate last flow (which may include additional processing) to be adequately described. Regardless, the end structure of either a gate first or a gate last process flow will include the final gate stack 261, as will be apparent in light of this disclosure.

Figure 13:
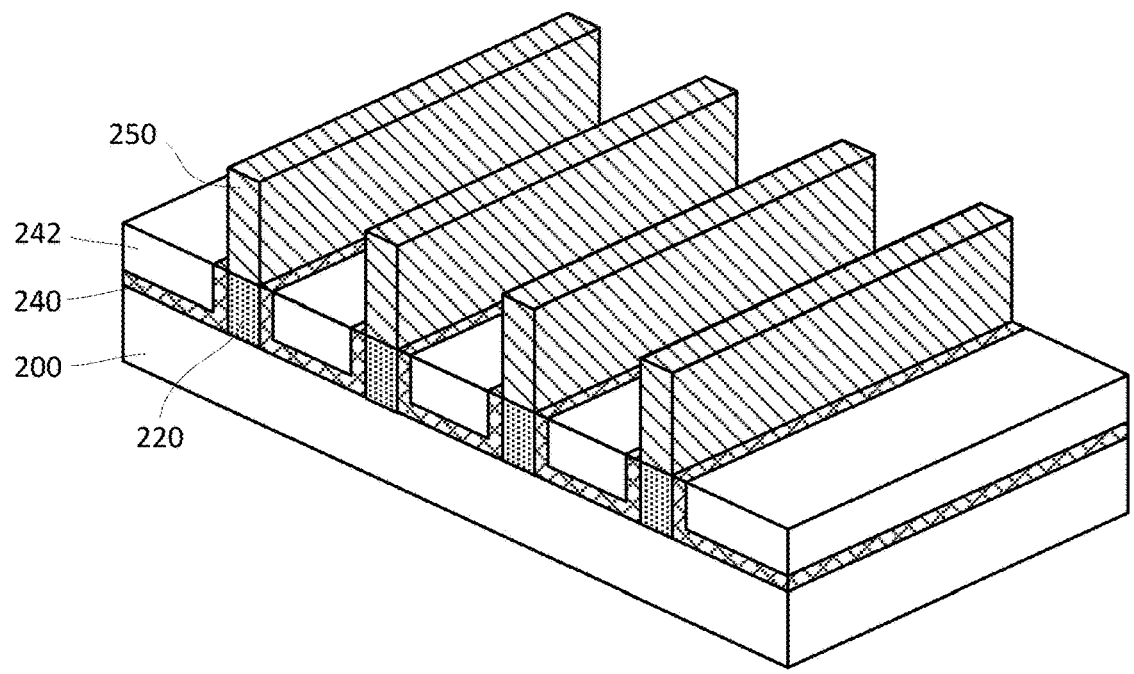
FIGS. 13-14 illustrate the example structures of FIGS. 11-12, respectively, after recessing the liner material and insulator layer to expose the channel material in accordance with some such embodiments of the present disclosure.
Figure 14:
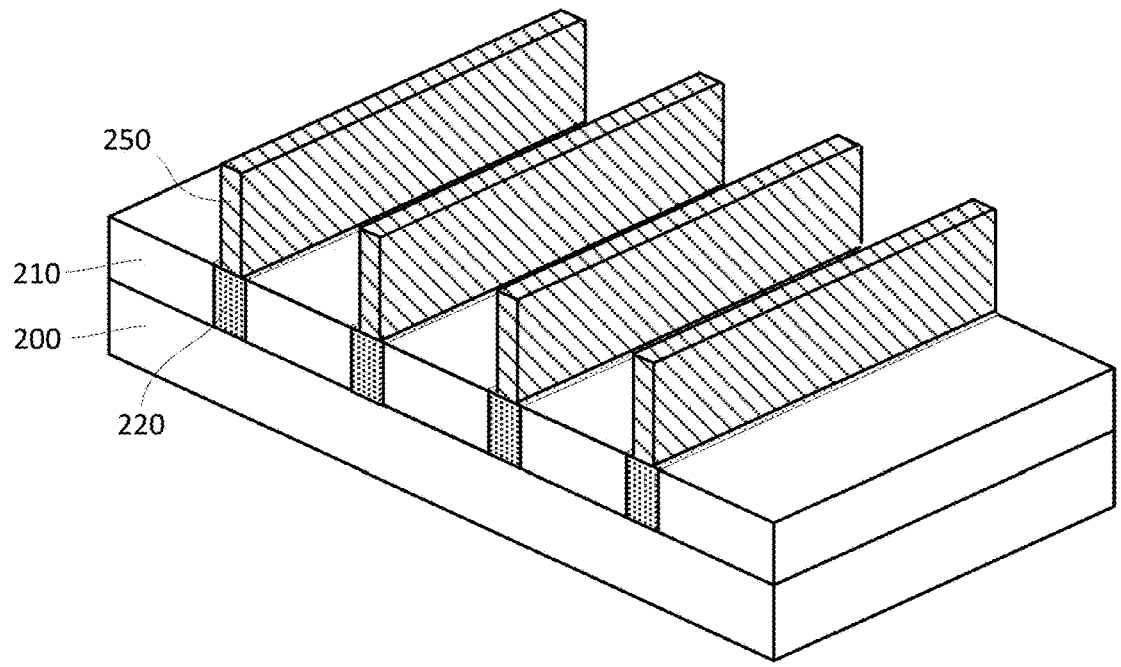
Figure 15:
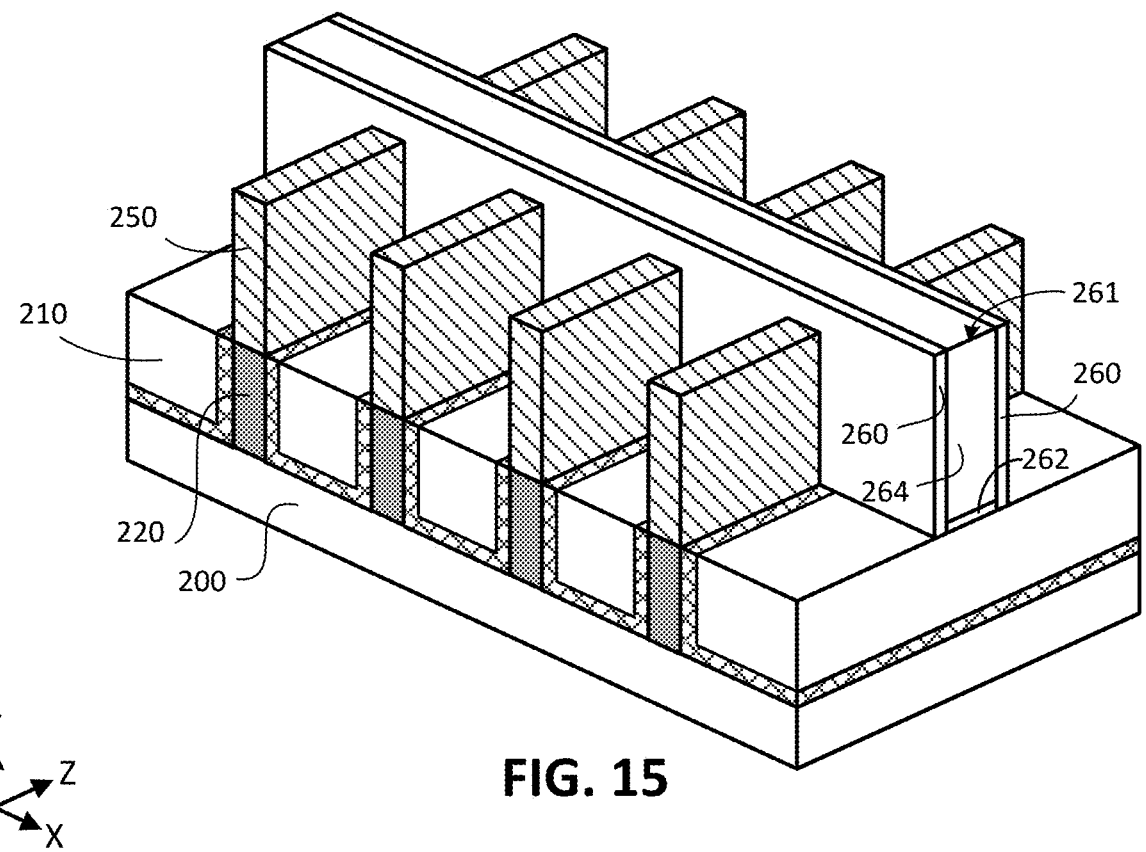
FIG. 15 illustrates the example structure of FIG. 13 after forming a gate structure or dummy gate structure over the fin-shaped channel material in accordance with some such embodiments of the present disclosure. Note that the gate structure could be similarly applied to the fin-shaped channel to the example structure of FIG. 14, according to other embodiments, as will be appreciated.

In this example embodiment, the processing includes forming on the example structure of FIG. 13 or 14 a dummy gate stack 261 that includes dummy gate dielectric 262 and dummy gate electrode 264, resulting in example structure of FIG. 15 in accordance with some embodiments. Recall that the formation of the dummy gate stack 261 is optional, because it need not be performed in all embodiments (such as those employing a gate first process flow). In this example embodiment, dummy gate dielectric 262 (e.g., dummy oxide material) and dummy gate electrode 264 (e.g., dummy poly-silicon material) may be used for a replacement gate process. Note that side-wall spacers 260, referred to generally as gate spacers (or simply, spacers), on either side of the dummy gate stack 261 were also formed, and such spacers 260 can help determine the channel length and/or help with replacement gate processing, for example.

Formation of the dummy gate stack 261 may include depositing the dummy gate dielectric material 262 and dummy gate electrode material 264, patterning the dummy gate stack 261, depositing gate spacer material 260, and performing a spacer etch to form the structure shown in FIG. 15, for example. Spacers 260 may include any suitable material, such as any suitable electrical insulator, dielectric, oxide (e.g., silicon oxide), and/or nitride (e.g., silicon nitride) material, as will be apparent in light of this disclosure. Note that in some embodiments, a hardmask (not shown) may be formed over the dummy gate stack (which may or may not also be formed over spacers 260) to protect the dummy gate stack during subsequent processing, for example.

Figure 18:
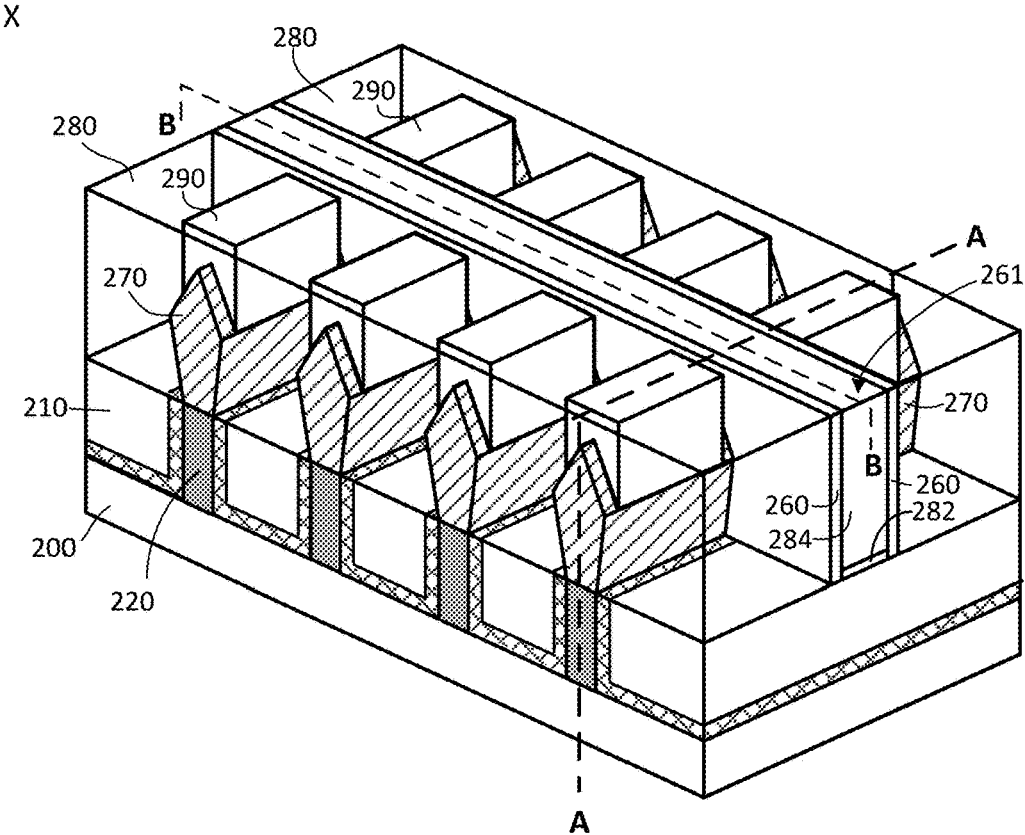
FIG. 18 illustrates the example structure of FIG. 16 after processing source/drain contacts in accordance with some embodiments of the present disclosure.

As can be understood based on this disclosure, and as also shown in FIG. 18 and the example cross-sectional illustration of FIG. 19, the dummy gate stack 261 (and spacers 260) help define the channel region 255 and source/drain (S/D) regions 270 of each fin of channel layer 250, where the channel region 255 is below the dummy gate stack 261 (as it will be located below the final gate stack 261), and the S/D regions 270 are on either side of and adjacent the channel region 255. Note that because the IC structures are being described in the context of forming finned transistors 295, the final gate stack 261 will also be adjacent to either side of the finned channel layer 250, as the gate stack 261 will reside along three walls of the finned channel layer 250 and/or wrap around the active fin portion (e.g., channel layer 250) from one region of an interlayer dielectric (ILD) material 280 to another region of interlayer dielectric (ILD) material 280, in some such embodiments.

Figure 16:
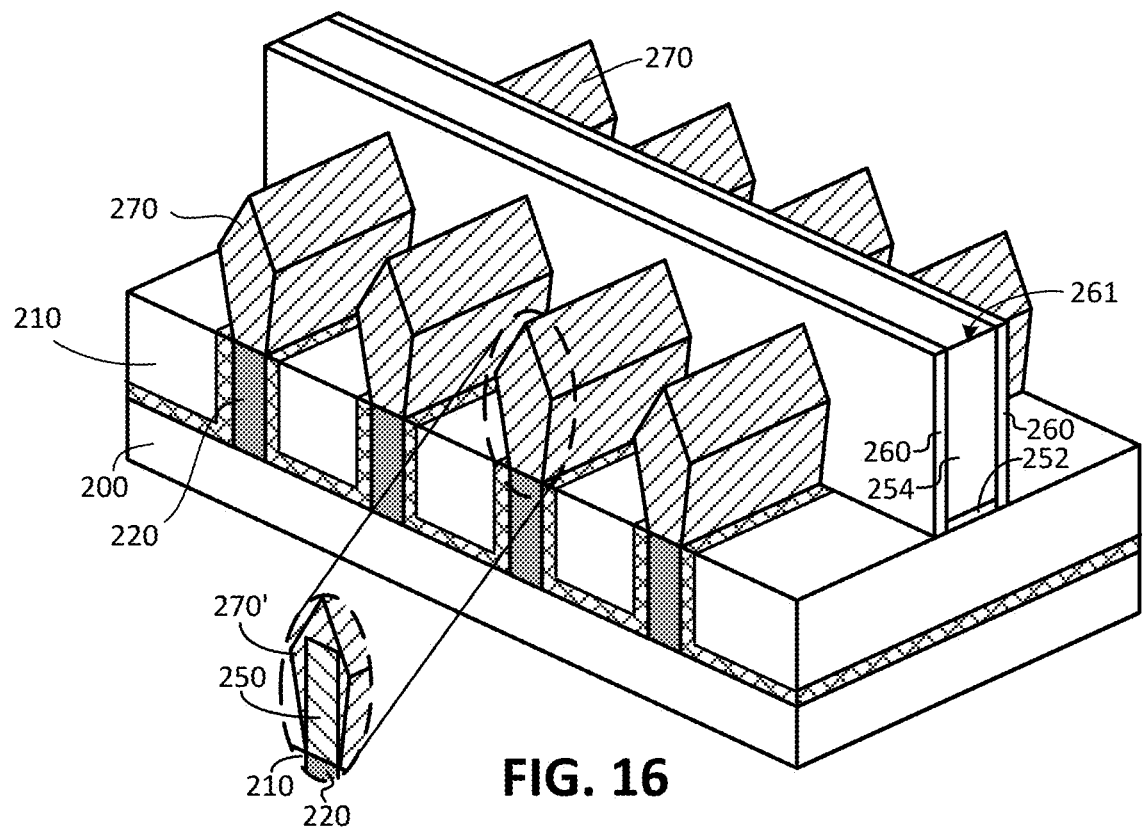
FIG. 16 illustrates the example structure of FIG. 15 after processing the source and drain regions in accordance with some embodiments of the present disclosure.

Method 100 of FIG. 1 continues with processing 124 source and drain (S/D) region 270 to form the example resulting structure of FIG. 16, in accordance with some embodiments. The S/D regions 270, in some embodiments, may be formed using any suitable techniques, such as masking regions outside of the S/D regions to be processed, etching at least a portion of the exposed fins of channel layer 250 from the structure of FIG. 15, and forming/depositing/ growing the S/D regions 270 (e.g., using any suitable techniques, such as CVD, PVD, ALD, VPE, MBE, LPE), for example. However, in some embodiments, the exposed fins (which in the embodiment of FIG. 15 includes channel layer 250 material) need not be completely removed, but they may remain (at least in part) in the final S/D regions 270 and are doped, implanted, and/or clad with final S/D material and/or have any other suitable processing performed to convert them into suitable final S/D regions 270, for example. For instance, FIG. 16 illustrates an enlarged view of one S/D region 270 formed using a cladding scheme, in accordance with some embodiments. As shown in the enlarged view, the final S/D material 270' was formed on the original exposed fin of channel layer 250 material in that S/D location. In the example embodiment of FIG. 16, since the material of the S/D regions 270 is replacement material, a distinct interface is defined between the underlying subfin 220 and S/D regions 270. In some embodiments, one or more of the S/D regions 270 may have a multilayer structure including two or more distinct layers, for example. For instance, in FFFET configurations, the source region has a bi-layer structure that includes two oppositely doped layers (e.g., one is n-type doped and the other is p-type doped), for example. In some embodiments, one or more of the S/D regions 270 may include grading (e.g., increasing and/or decreasing) the content/concentration of one or more materials in some or all of the region(s). For instance, in some embodiments, it may be desired to increase the grading as a given S/D region 270 is formed, to have a relatively lower doping concentration near the channel region 255 and a relatively higher doping concentration near the corresponding S/D contact 290.

In some embodiments, the S/D regions 270 may be formed one polarity at a time, such as performing processing for one of n-type and p-type S/D regions 270, and then performing processing for the other of the n-type and p-type S/D regions 270. In some embodiments, the S/D regions 270 may include any suitable material, such as monocrystalline group IV and/or group III-V semiconductor material and/or any other suitable semiconductor material, as will be apparent in light of this disclosure. In some embodiments, the S/D regions 270 corresponding to a given channel region 255 may include the same group of semiconductor material as what is included in the given channel layer 250, such that if the given channel layer 250 includes group IV semiconductor material, the corresponding S/D regions 270 may also include group IV semiconductor material (whether the same IV material or different); however, the present disclosure is not intended to be so limited. In some embodiments, the S/D regions 270 may include any suitable doping scheme, such as including suitable n-type and/or p-type dopant (e.g., in a concentration in the range of 1E16 to 1E22 atoms per cubic cm). However, in some embodiments, at least one S/D region 270 may be undoped/intrinsic or relatively minimally doped, such as including a dopant concentration of less than 1E16 atoms per cubic cm, for example.

To provide some example configurations, in embodiments where corresponding S/D regions 270 on either side of a given channel layer 250 are to be used for a MOSFET device, the S/D regions 270 may include the same type of dopants (e.g., where both are p-type doped or both are n-type doped). Specifically, for an NMOS device, the included S/D regions 270 include semiconductor material that is n-type doped, and for a PMOS device, the included S/D regions 270 include semiconductor material that is p-type doped, in some embodiments. Whereas for a TFET device, the S/D regions 270 for a given channel region 255 may be oppositely doped, such that one is p-type doped and the other is n-type doped, in some embodiments.

Note that for ease of illustration and description, all S/D regions 270 are shown as being the same and are identified collectively by numeral 270. However, in some embodiments, the S/D regions 270 may include differing materials, dopant schemes, shapes, sizes, corresponding channel regions (e.g., 1, 2, 3, or more), and/or any other suitable difference as can be understood based on this disclosure. For instance, the S/D regions 270 of FIG. 16 is shown as a pentagon or diamond-like shape (as viewed in the X-Y plane). A domed shape (as viewed in the X-Y plane) or rectangular shape is also acceptable, to provide a few examples. Further note that the shading or patterning of the features/layers of the IC structures included in the Figures (such as S/D regions 270) is provided merely to assist in visually distinguishing those different IC features/layers. Such shading or patterning is not intended to limit the present disclosure in any manner. Numerous transistor S/D configurations and variations will be apparent in light of this disclosure.

Method 100 of FIG. 1 continues with processing 126 the final gate stack 261 to form the example resulting structure of FIG. 17, in accordance with some embodiments. As shown in FIG. 17, the processing in this example embodiment includes depositing an interlayer dielectric (ILD) material 280 on the structure of FIG. 16, followed by optional planarization and/or polishing (e.g., CMP) to reveal the dummy gate stack 261. Note that the ILD material 280 is shown as transparent in the example structure of FIG. 16 to allow for the underlying features to be seen (and the ILD material 280 may actually be transparent or translucent at such a small scale); however, the present disclosure is not intended to be so limited. Also, note that the ILD layer 280 may include a multilayer structure, even though it is illustrated as a single layer. Further note that in some cases, ILD material 280 and insulating layer 210 may not include a distinct interface as illustrated in FIG. 17, particularly where, e.g., the ILD layer 280 and insulating layer 210 include the same dielectric material. In some embodiments, the ILD layer 280 may include any suitable material, such as one or more oxides (e.g., silicon dioxide), nitrides (e.g., silicon nitride), dielectrics, and/or an electrically insulating material, for example.

The gate stack processing, in this example embodiment, continued with removing the dummy gate stack 261 (including dummy gate electrode 264 and dummy gate dielectric 262) to allow for the final gate stack 261 to be formed. Recall that in some embodiments, the formation of the final gate stack 261, which includes gate dielectric 282 and gate electrode 284, may be performed using a gate first fabrication flow (e.g., an up-front hi-k gate process). In such embodiments, the final gate processing 122 may have been performed prior to the S/D processing 124, for example. Further, in such embodiments, process 126 need not be performed, as the final gate stack 261 would have already been formed in process 122. However, in this example embodiment, the gate stack 261 is formed using a gate last fabrication flow, which may also be considered a replacement gate or replacement metal gate (RMG) process. In such gate last processing, the process may include dummy gate oxide 282 deposition, dummy gate electrode 284 (e.g., poly-Si) deposition, and, optionally, patterning hardmask deposition, as previously described. Regardless of whether gate first or gate last processing is employed, the final gate stack 261 can include gate dielectric 282 and gate electrode 284 as shown in FIG. 17 and described herein, in accordance with some embodiments.

Note that when the dummy gate is removed, the channel regions 255 of the previously formed fins (which include channel layer 250, in this example case) that were covered by the dummy gate are exposed to allow for any desired processing of those channel layer 250 fins. Such processing of the channel layer 250 fins may include various different techniques, such as removing and replacing the channel layer 250 with replacement material, doping the channel layer 250 material of the fin as desired, forming the channel layer 250 fin into one or more nanowires (or nanoribbons) for a gate-all-around (GAA) transistor configuration, forming the channel layer 250 material fin into a beaded-fin configuration, cleaning/polishing the channel layer 250, and/or any other suitable processing as will be apparent in light of this disclosure. For instance, finned channel regions 255, defined by fins of channel layer 250 and 252, are illustrated in FIG. 17 as the right-most finned structure and the second-from-the-right finned structure, respectively. Channel layer 250 material layer and the second finned channel layer 252 may include any suitable configuration. For instance, in some embodiments, second finned channel layer 252 may include a second channel layer 250 material that is compositionally different from the first channel layer 250 material, to provide some examples. Thus, finned channel layer 250 may be used for an n-channel or p-channel finned transistor device, while second finned channel layer 252 may be used for the other of an n-channel or p-channel finned transistor device, in accordance with an example embodiment. Further, in such an example embodiment, both of the finned channel layers 250 and 252 may be included in a complementary transistor circuit (e.g., a CMOS circuit), for instance.

In addition to finned configurations utilizing a tri-gate or double-gate structure, other non-planar transistor configurations are also shown in the example structure of FIG. 17. As shown in FIG. 17, nanowire channel region 256 includes two nanowires (or nanoribbons) in this example case. For instance, nanowire channel region 256 may be formed after removing the dummy gate stack 261 to expose channel layer 250, such as by converting the finned channel layer 250 at that location into nanowires 256 using any suitable techniques. For example, the original finned channel layer 250 may have included a multilayer structure with one or more sacrificial layers. In such case, a selective etch was performed to remove the sacrificial layer(s) and define the nanowires 256. In some embodiments, a nanowire (or nanoribbon or GAA) transistor formed using the techniques disclosed herein may include any number of nanowires (or nanoribbons) such as 1, 3, 4, 5, 6, 7, 8, 9, 10, or more, depending on the desired configuration. In some embodiments, a nanowire or nanoribbon may be considered fin-shaped where the gate stack 261 wraps around each fin-shaped nanowire or nanoribbon in a GAA transistor configuration.

To provide yet another example non-planar transistor configuration, beaded-fin channel region 254 is a hybrid between a finned channel region and a nanowire channel region, where a sacrificial material 259 was partially removed to define the resulting beaded-fin structure shown. In contrast, sacrificial material 259 can be completely removed to define nanowires. Such a beaded-fin channel region 254 structure may benefit, for example, from increased gate control (e.g., compared to a finned channel region 250, 252 structure) while also having relatively reduced parasitic capacitance (e.g., compared to a nanowire channel region 256 structure). Therefore, numerous different channel region 255 configurations can be employed using the techniques described herein, including planar and various non-planar configurations.

As can be understood based on this disclosure, the channel region 255 may be at least below the gate stack 261, in some embodiments. For instance, in the case of a planar transistor configuration, the channel region 255 may just be below the gate stack 261. However, in the case of a finned transistor configuration, the channel region 255 may be below and between the gate stack 261, since the gate stack 261 may be formed on the top and opposing sides of the finned structure (e.g., in a tri-gate manner). Further, in the case of a nanowire (or nanoribbon or GAA) transistor configuration, the gate stack 261 may substantially (or completely) surround each nanowire/nanoribbon in the channel region 255 (e.g., wrap around at least 80, 85, 90, or 95% of each nanowire/nanoribbon). Regardless, in some embodiments, the gate of a transistor may be proximate to the channel region 255 of that transistor. Generally, in some embodiments, the channel region 255 may include any suitable material, such as monocrystalline group IV and/or group III-V semiconductor material, for example. In some embodiments, the channel region 255 of a given transistor 295 may be doped (e.g., with any suitable n-type and/or p-type dopants) or intrinsic/undoped, depending on the particular configuration. Note that S/D regions 270 are adjacent to either side of a given channel region 255, as can be seen in FIGS. 17-19. In other words, each channel region 255 is between corresponding S/D regions 270. Also, note that the configuration or geometry of a transistor 295 formed using the techniques described herein may primarily be described based on the shape or configuration of the respective channel region 255 of that transistor 295, for example. In one example, a nanowire (or nanoribbon or GAA) transistor may be referred to as such because it includes one or more nanowires (or nanoribbons) in the channel region 255 of that transistor, but the S/D regions 270 need not include such a nanowire (or nanoribbon) shape.

Continuing with the example structure of FIG. 17, after the dummy gate has been removed and any desired channel region processing has been performed, the final gate stack 261 can be formed, in accordance with some embodiments. In this example embodiment, the final gate stack 261 includes gate dielectric 282 and gate electrode 284, as shown in FIG. 17. The gate dielectric 282 may include, for example, any suitable oxide (such as silicon dioxide), high-k dielectric material, and/or any other suitable material as will be apparent in light of this disclosure. Examples of high-k dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, to provide some examples. In some embodiments, an annealing process may be carried out on the gate dielectric 282 to improve its quality when high-k dielectric material is used. The gate electrode 284 may include a wide range of materials, such as polysilicon or various suitable metals or metal alloys, such as aluminum (Al), tungsten (W), titanium (Ti), tantalum (Ta), copper (Cu), titanium nitride (TiN), or tantalum nitride (TaN), for example.

In some embodiments, gate dielectric 282 and/or gate electrode 284 may include a multilayer structure of two or more material layers, for example. For instance, in some embodiments, a multilayer gate dielectric 282 may be employed to provide a more gradual electric transition from the channel region 255 to the gate electrode 284, for example. In some embodiments, gate dielectric 282 and/or gate electrode 284 may include grading (e.g., increasing and/or decreasing) the content or concentration of one or more materials in at least a portion of the feature(s). In some embodiments, one or more additional layers may also be present in the final gate stack 261, such as one or more relatively high or low work function layers and/or other suitable layers. Note that although gate dielectric 282 is shown as being positioned below gate electrode 284 in the example embodiment of FIG. 17, in other embodiments, the gate dielectric 282 may also be present on one or both sides of gate electrode 284, such that the gate dielectric 282 is between gate electrode 284 and one or both spacers 260, for example. Numerous different gate stack configurations will be apparent in light of this disclosure.

Method 100 of FIG. 1 continues with forming 128 S/D contacts 290 to form the example resulting structure of FIG. 18, in accordance with some embodiments. As shown in FIG. 18, S/D S/D contacts 290 were formed in contact with each of the S/D regions 270, in this example embodiment. In some embodiments, S/D contacts 290 may be formed 128 using any suitable techniques, such as forming contact trenches in ILD layer 280 over the respective S/D regions 270 and depositing metal or metal alloy (or other suitable electrically conductive material) in the trenches. In some embodiments, forming 128 S/D contacts 290 processing may include silicidation, germanidation, III-V-idation, and/or annealing processes, for example. In some embodiments, S/D contacts 290 may include aluminum or tungsten, although any suitable conductive metal or alloy can be used, such as silver, nickel-platinum, or nickel-aluminum, for example. In some embodiments, one or more of the S/D contacts 290 may include a resistance reducing metal and a contact plug metal, or just a contact plug, for instance. Example contact resistance reducing metals include, for instance, nickel, aluminum, titanium, gold, gold-germanium, nickel-platinum, nickel aluminum, and/or other such resistance reducing metals or alloys. Example contact plug metals include, for instance, aluminum, copper, nickel, platinum, titanium, or tungsten, or alloys thereof, although any suitably conductive contact metal or alloy may be used. In some embodiments, additional layers may be present in the S/D contact 290 regions, such as adhesion layers (e.g., titanium nitride) and/or liner or barrier layers (e.g., tantalum nitride), if so desired. In some embodiments, a contact resistance reducing layer may be present between a given S/D region 270 and its corresponding S/D contact 290, such as a relatively highly doped (e.g., with dopant concentrations greater than 1E18, 1E19, 1E20, 1E21, or 1E22 atoms per cubic cm) intervening semiconductor material layer, for example. In some such embodiments, the contact resistance reducing layer may include semiconductor material and/or impurity dopants based on the included material and/or dopant concentration of the corresponding S/D region, for example.

Method 100 of FIG. 1 continues with completing 130 a general integrated circuit (IC) as desired, in accordance with some embodiments. Such additional processing to complete an IC may include back-end or back-end-of-line (BEOL) processing to form one or more metallization layers and/or to interconnect the transistor devices formed, for example. Any other suitable processing may be performed, as will be apparent in light of this disclosure. Note that the processes in method 100 of FIG. 1 are shown in a particular order for ease of description. However, one or more of the processes may be performed in a different order or may not be performed at all (and thus be optional), in accordance with some embodiments. For example, processes 107 and 108 may be optional in some embodiments, as previously described. Further, processes 104 may be alternatively performed using a replacement fin-based approach, in accordance with some embodiments. Numerous variations on method 100 and the techniques described herein will be apparent in light of this disclosure.

Figure 19:
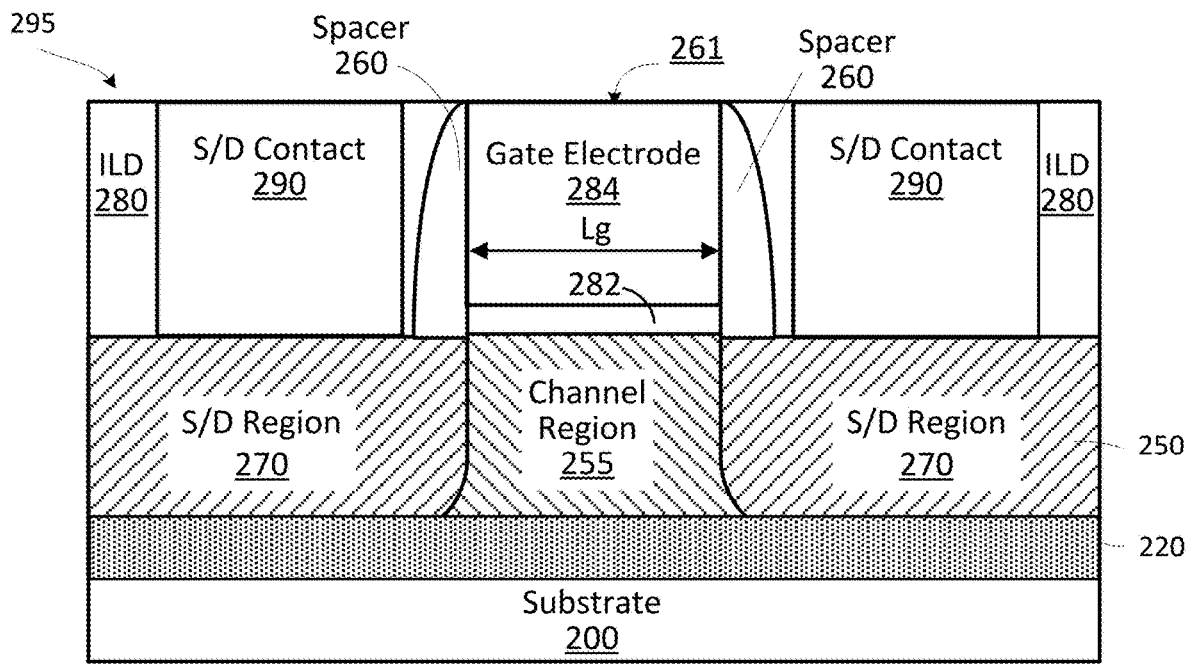
FIG. 19 illustrates an example cross-sectional view taken through plane A-A of FIG. 18, in accordance with some embodiments of the present disclosure.

FIG. 19 illustrates an example cross-sectional view taken along plane A-A shown in FIG. 18, in accordance with some embodiments of the present disclosure. The cross-sectional view of FIG. 19 is provided to assist in illustrating different features of the structure of FIG. 18, for example. Therefore, the previous relevant description with respect to the each similarly numbered feature is equally applicable to FIG. 19. However, note that the dimensions of the features shown in FIG. 19 may differ in some ways (relative to the features in the structure of FIG. 18), for ease of illustration. Note also that some variations occur between the structures, such as the shape of spacers 260 and of the finned channel region 255 (which includes channel layer 250, in the example embodiments), for instance. In some embodiments, the length of gate electrode 284 (e.g., the dimension between spacers 260 in the Z-axis direction), which is indicated as Lg, may be any suitable length as can be understood based on this disclosure. For instance, in some embodiments, the gate length Lg may be in the range of 3-100 nm (e.g., 3-10, 3-20, 3-30, 3-50, 5-10, 5-20, 5-30, 5-50, 5-100, 10-20, 10-30, 10-50, 10-100, 20-30, 20-50, 20-100, or 50-100 nm), or any other suitable value or range as will be apparent in light of this disclosure. In some embodiments, the gate length Lg may be less than a given threshold, such as less than 100, 50, 40, 30, 25, 20, 15, 10, 8, or 5 nm, or less than any other suitable threshold as will be apparent in light of this disclosure. For instance, in some embodiments, the gate length may be the same as or similar to the channel length (e.g., the gate length may be approximately longer than the channel length, such as 1-20% longer, due to potential diffusion of dopant from the S/D regions into the channel region and/or due to the use of S/D region tips that extend under the gate stack), which may also be any suitable length as can also be understood based on this disclosure. In some embodiments, the techniques enable maintaining a desired device performance when scaling to such low thresholds, such as sub-50, sub-40, sub-30, or sub-20 nm thresholds, as can be understood based on this disclosure.

Figure 20:
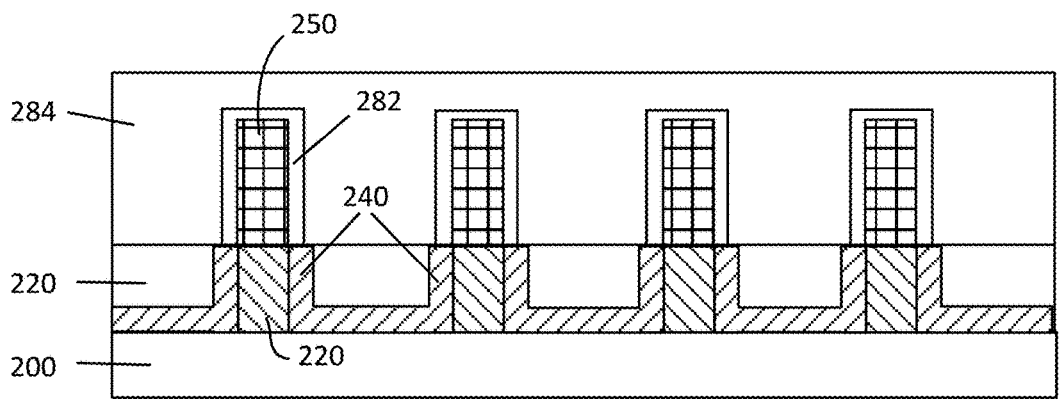
FIG. 20 illustrates a longitudinal section taken through plane B-B of FIG. 18, showing the gate structure formed on the channel layer material and liner material below in accordance with some embodiments of the present disclosure.
Figure 21:
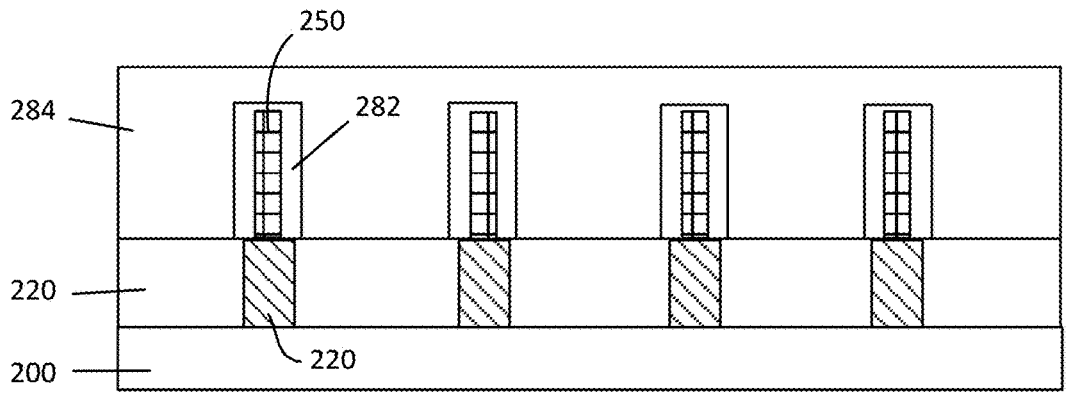
FIG. 21 illustrates an example of a longitudinal section taken through the gate structure similar to as done for FIG. 20, but where the channel layer material is narrower than the subfin layer, such as shown in FIG. 14, in accordance with other embodiments of the present disclosure.

FIGS. 20-21 illustrate longitudinal sections taken through the gate structure and semiconductor fins in accordance with embodiments of the present disclosure. FIG. 20 is a longitudinal section taken along plane B-B of the example structure shown in FIG. 18, where liner 240 material is adjacent subfins 240, such as resulting from the example structure shown in FIG. 13. FIG. 21 illustrates a similar longitudinal section taken through the gate structure, where the channel layer 250 material has a narrower width than subfin 220 material below it, such as shown in the example structure of FIG. 14 where liner material 240 had previously been formed as a sacrificial layer.

Figure 22:
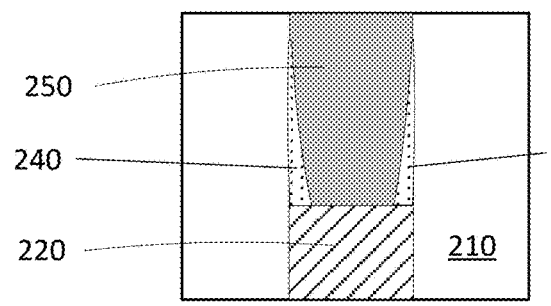
FIG. 22 illustrates an example of indium phosphide channel material formed on gallium arsenide subfin material in a trench lined with silicon nitride liner material in accordance with some embodiments of the present disclosure. The indium phosphide channel material is virtually free of stacking faults.
Figure 23:
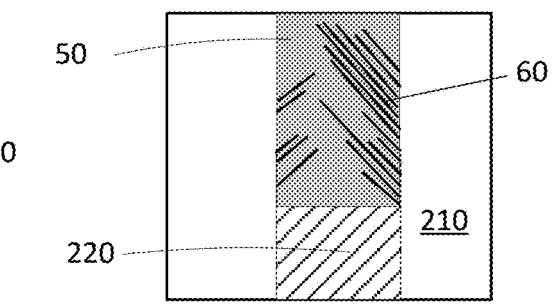
FIG. 23 illustrates an example of an indium phosphide channel material formed on a gallium arsenide subfin with $SiO_2$ trench sidewalls in accordance with standard methods, where the indium phosphide channel material exhibits stacking faults emanating from the $SiO_2$ sidewall s.

FIG. 22 is an illustration showing an example stack of layers including subfin 220 of GaAs, and channel layer 250 of InP, in accordance with some embodiments of the present disclosure. The InP channel 250 material was grown on subfin 220 with a trench lined with liner 240 of SiN, such as performed in processes 107-113 discussed above. A residual amount of liner 240 material remains along the sides of channel 250 material after recessing the liner and insulating material to expose the channel layer 250 material. The InP channel layer 250 is virtually free of stacking faults. In contrast, FIG. 23 illustrates an example of an InP channel layer 50 prepared on a GaAs subfin 220 and with $SiO_2$ sidewalls (i.e., no liner 240) according to standard methods. The InP channel layer 50 in FIG. 23 exhibits significant stacking faults 60 extending from the $SiO_2$ sidewalls. FIGS. 22-23 illustrate an example of using TEM analysis to identify techniques and structures disclosed herein based on the presence or lack of stacking faults 60 in the channel layer 250 material, such as stacking faults 60 emanating from $SiO_2$ sidewalls or the like.

In some embodiments, the channel 250 layer may have a relatively low defect/stacking fault density, such as less than 1E6 per square cm, which is the resolution of TEM. In some such embodiments, the channel layer 250 material may have a defect/stacking fault density of at most 1E9, 5E8, 1E8, 5E7, 1E7, 5E6, 1E6, 5E5, 1E5, 5E4, or 1E4 per square cm, for example. In some embodiments, the channel layer 250 has virtually no defects or stacking faults 60 emanating from sidewalls 245. Note that some stacking faults 60 may exist in channel layer 250 when prepared in accordance with some embodiments of the present disclosure, but such defects are not visible due to the resolution limits of TEM showing only features greater than about 0.2 nm in size.

Example System

Figure 24:
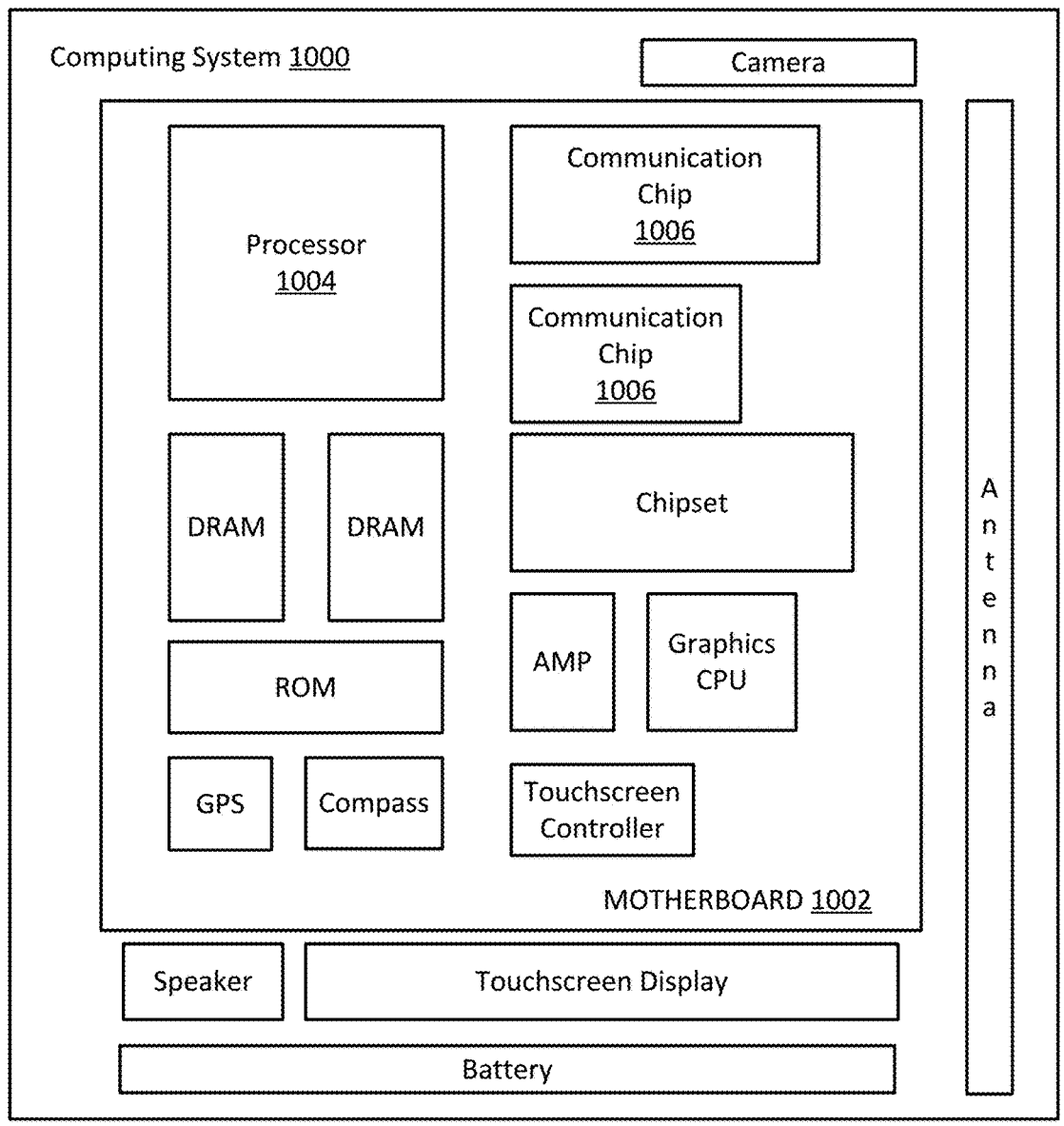
FIG. 24 illustrates an example computing system implemented with integrated circuit structures and/or transistor devices formed in accordance with some embodiments of the present disclosure.

FIG. 24 illustrates a computing system 1000 implemented with integrated circuit structures and/or transistor devices formed using the techniques disclosed herein, in accordance with some embodiments of the present disclosure. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc.

Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices formed using the disclosed techniques in accordance with an example embodiment. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments, the integrated circuit die of the processor includes onboard circuitry that is implemented with one or more integrated circuit structures or devices formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices formed using the disclosed techniques as variously described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing system 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device or system that processes data or employs one or more integrated circuit structures or devices formed using the disclosed techniques, as variously described herein. Note that reference to a computing system is intended to include computing devices, apparatuses, and other structures configured for computing or processing information.

FURTHER EXAMPLE EMBODIMENTS

The following examples pertain to further embodiments, from which numerous permutations and configurations will be apparent.

Example 1 is an integrated circuit (IC) with at least one transistor, the IC comprising a semiconductor fin comprising a subfin layer of a subfin material, the subfin material being a first group III-V compound; and a channel layer of a channel material directly on the subfin layer and extending upwardly therefrom, the channel material being a second group III-V compound different from the first group III-V compound; and a gate structure in direct contact with the channel layer of the semiconductor fin, wherein the gate structure is further in direct contact with one of a top surface of the subfin layer, the top surface being exposed where the channel layer meets the subfin layer because the channel layer is narrower than the subfin layer, or a liner layer of liner material in direct contact with opposing sidewalls of the subfin layer, the liner material being distinct from the first and second group III-V compounds.

Example 2 includes the subject matter of Example 1, wherein the channel material comprises indium and phosphorous.

Example 3 includes the subject matter of Example 1 or 2, wherein the subfin layer comprises gallium and arsenic.

Example 4 includes the subject matter of any of Examples 1-3, wherein the channel material has virtually no stacking faults.

Example 5 includes the subject matter of any of Examples 1-4, wherein the channel layer has a carrier mobility of at least 400 $cm^2/vs$.

Example 6 includes the subject matter of Example 5, wherein the carrier mobility is at least 600 $cm^2/vs$.

Example 7 includes the subject matter of Example 6, wherein the carrier mobility is at least 700 $cm^2/vs$.

Example 8 includes the subject matter of Example 7, wherein the carrier mobility is at least 1000 $cm^2/vs$.

Example 9 includes the subject matter of any of Examples 1-8, further comprising a substrate, the subfin layer being in direct contact with the substrate.

Example 10 includes the subject matter of any of Examples 1-9 further comprising the liner of liner material directly on opposing sidewalls of the subfin layer.

Example 11 includes the subject matter of Example 10, wherein the liner material has a lattice mismatch that is no greater than 4% with respect to the channel material.

Example 12 includes the subject matter of Examples 11, wherein the liner material is lattice matched to the channel material.

Example 13 includes the subject matter of any of Examples 1-12, wherein the channel material comprises indium and phosphorous.

Example 14 includes the subject matter of any of Examples 1-13, wherein the liner material comprises indium, gallium, and arsenic.

Example 15 includes the subject matter of Example 14, wherein the liner material has a ratio of indium to gallium to arsenic of 0.53:0.47:1.

Example 16 includes the subject matter of Example 10, wherein the liner material is a non-$SiO_2$ dielectric.

Example 17 includes the subject matter of Example 16, wherein the non-$SiO_2$ dielectric is selected from silicon nitride, aluminum oxide, hafnium oxide, and titanium dioxide.

Example 18 includes the subject matter of any of Examples 10-17, further comprising an insulator layer distinct from and in direct contact with the liner layer, such that the liner layer is between the insulator layer and the subfin layer.

Example 19 includes the subject matter of any of Examples 1-18, wherein the gate structure is further in direct contact with the top surface of the subfin layer.

Example 20 includes the subject matter of Example 19, wherein the subfin layer has a subfin width that is at least 2 nm greater than a channel width of the channel layer as measured at an interface between the subfin layer and the channel layer.

Example 21 includes the subject matter of any of Examples 1-20, wherein the channel width is less than 10 nm.

Example 22 includes the subject matter of any of Example 1-21, further comprising a substrate, wherein the substrate comprises at least one of silicon, carbon, germanium, hydrogen, helium, phosphorous, boron, arsenic, antimony, tin, indium, gallium, or argon.

Example 23 includes the subject matter of Example 22, wherein the substrate material consists essentially of silicon.

Example 24 includes the subject matter of any of Examples 1-23, wherein the substrate material consists essentially of bulk silicon.

Example 25 includes the subject matter of any of Examples 1-24, wherein the subfin layer has a vertical subfin height from 40 nm to 60 nm.

Example 26 includes the subject matter of any of Examples 1-25, wherein the channel layer has a vertical channel layer height from 100 nm to 300 nm.

Example 27 includes the subject matter of any of Examples 1-26, wherein the at least one transistor includes at least one of a field-effect transistor (FET), metal-oxide-semiconductor FET (MOSFET), tunnel-FET (TFET), a planar configuration, a finned configuration, a Fin-FET configuration, a tri-gate configuration, a nanowire configuration, and a nanoribbon configuration.

Example 28 includes the subject matter of any of Examples 1-27, wherein the at least one transistor includes at least one of a n-channel transistor and a p-channel transistor.

Example 29 includes the subject matter of any of Examples 1-27, further comprising a complementary metal-oxide-semiconductor (CMOS) circuit including a first transistor including the channel region and a second transistor formed above the first layer, wherein one of the first and second transistors is an n-channel transistor and the other of the first and second transistors is a p-channel transistor.

Example 30 is computing system comprising the IC of any of Examples 1-29.

Example 31 includes the subject matter of Example 30 further comprising a communication chip.

Example 32 includes the subject matter of Examples 30 or 31 further comprising a touch screen controller.

Example 33 includes the subject matter of Examples 30, 31, or 32 further comprising dynamic random access memory.

Example 34 is a transistor comprising a semiconductor fin comprising a subfin layer of a first group III-V material on the substrate; and a channel layer of a second group III-V material on the subfin layer; a layer of insulating material adjacent the subfin layer; a gate structure above and on opposing sidewalls of the channel layer; a source region adjacent the gate structure; and a drain region adjacent the gate structure; wherein the channel layer has a carrier mobility of at least 400 cm²/vs.

Example 35 includes the subject matter of Example 34, wherein the channel layer has virtually no defects emanating from sidewalls of the fin layer.

Example 36 includes the subject matter of Examples 34 or 35, wherein the gate structure directly contacts the channel layer on three sides.

Example 37 includes the subject matter of any of Examples 34-36 further comprising a liner of liner material on sidewalls of the subfin layer and the layer of insulating material, such that the liner is between the layer of insulating material and the subfin layer.

Example 38 includes the subject matter of Example 37, wherein the liner material has a lattice mismatch that is no greater than 4% with respect to the channel material.

Example 39 includes the subject matter of Example 38, wherein the liner material is lattice matched to the channel material.

Example 40 includes the subject matter of any of Examples 30-39, wherein the channel layer comprises indium and phosphorous.

Example 41 includes the subject matter of any of Examples 37-40, wherein the liner material comprises indium, gallium, and arsenic.

Example 42 includes the subject matter of Example 41, wherein the liner material has a ratio of indium to gallium to arsenic of 0.53:0.47:1.

Example 43 includes the subject matter of Example 34 further comprising a residual layer of non-SiO₂ dielectric on opposing sidewalls of the channel layer, the residual layer of non-SiO2 dielectric having a thickness less than 2 nm.

Example 44 includes the subject matter of Example 43, wherein the residual layer of non-SiO2 dielectric is selected from silicon nitride, aluminum oxide, hafnium oxide, and titanium dioxide.

Example 45 includes the subject matter of any of Examples 34-42, wherein the transistor is structured as one of a field-effect transistor (FET), metal-oxide-semiconductor FET (MOSFET), tunnel-FET (TFET), a planar configuration, a finned configuration, a Fin-FET, a tri-gate FET, a nanowire FET, a nanoribbon FET, an NFET, and a PFET.

Example 46 is an integrated circuit (IC) with at least one transistor, the IC comprising: a semiconductor fin comprising a first layer of a first group III-V compound; and a second layer on the first layer and extending upwardly therefrom, the second layer being a second group III-V compound different from the first group III-V compound; and a gate structure in direct contact with the second layer of the semiconductor fin, wherein the gate structure is further in direct contact with one of a top surface of the first layer, the top surface being exposed where the second layer meets the first layer because the second layer is narrower than the first layer, or a third material layer in direct contact with opposing sidewalls of the first layer, the third material layer being distinct from the first and second group III-V compounds.

Example 47 includes the subject matter of Example 46, wherein the gate structure is in direct contact with the top surface of the first layer.

Example 48 includes the subject matter of Examples 46 or 47, further comprising an insulator layer in direct contact with the opposing sidewalls of the first layer.

Example 49 includes the subject matter of any of Examples 46-48, wherein the first layer has a first width that is at least 2 nm greater than a second width of the second layer as measured at an interface between the first layer and the second layer.

Example 50 includes the subject matter of any of Examples 46-49, wherein the gate structure is in direct contact with the third material layer that is in direct contact with opposing sidewalls of the first layer.

Example 51 includes the subject matter of any of Examples 46-50, further comprising an insulator layer distinct from and in direct contact with the third material layer, such that the third material layer is between the insulator layer and the first layer.

Example 52 includes the subject matter of Examples 51 or 51, wherein the first layer has a first width that is substantially the same as a second width of the second layer as measured at an interface between the first layer and the second layer, such that the difference between first and second widths is less than 1 nm.

Example 53 is a method of forming a transistor, the method comprising: defining a trench in an insulating layer formed on a semiconductor base, the trench defining trench sidewalls extending to the semiconductor base; forming a subfin layer in a lower portion of the trench and in direct contact with the semiconductor base, the subfin layer comprising a group III-V material; forming a layer of liner material on the insulating layer and the trench sidewalls; recessing anisotropically the layer of liner material to expose a top surface of the subfin layer, wherein the trench sidewalls extend up from the subfin layer and are lined with the liner material; forming a fin of a second material in the trench and in direct contact with the subfin layer; and recessing the insulating layer and the layer of liner material to expose the fin of the second material.

Example 54 is a method of forming a transistor, the method comprising: defining a trench in an insulating layer disposed on a semiconductor base, the trench having trench sidewalls extending at least to a top surface of the semiconductor base; forming a first material in the trench and in direct contact with the semiconductor base, the first material comprising a group IV or a group III-V material; removing the insulating layer to expose the first material; forming a cladding layer over the first material and the semiconductor base; forming a second insulating layer on the cladding layer; polishing to remove the cladding layer and second insulating layer from a top surface of the first material; recessing the first material in the trench, thereby defining a lined trench with lined trench sidewalls extending up from a subfin of the first material; forming a fin of a second material in the lined trench and in direct contact with the subfin; and recessing the cladding layer and the insulating layer to expose the fin of the second material.

Example 55 includes the subject matter of Examples 53 or 54 further comprising: forming a gate electrode on the fin of the second material, forming a source region on a first end of the fin of the second material; and forming a drain region on a second side of the fin of the second material.

Example 56 includes the subject matter of Example 51, wherein the liner material comprises (i) indium, gallium, and arsenic, (ii) indium, gallium, and arsenic in a ratio of 0.53:0.47:1.0, (iii) silicon and nitrogen, (iv) aluminum and oxygen, (v) hafnium and oxygen, or (vi) titanium and oxygen.

Example 57 includes the subject matter of Example 54, wherein the cladding layer has a lattice mismatch of no more than 4% with respect to the second material.

Example 58 includes the subject matter of Example 57, wherein the cladding layer comprises (i) indium, gallium, and arsenic, (ii) indium, gallium, and arsenic in a ratio of 0.53:0.47:1.0, (iii) silicon and nitrogen, (iv) aluminum and oxygen, (v) hafnium and oxygen, or (vi) titanium and oxygen.

Example 59 includes the subject matter of any of Examples 53-58, wherein the fin of second material comprises indium and phosphorous.

Example 60 includes the subject matter of any of Examples 53-59, wherein forming the fin of the second material includes epitaxially growing the fin of the second material.

Example 61 includes the subject matter of Example 55, wherein completing the transistor structure includes forming the gate electrode in electrical contact with three sides of the fin of the second material.

Example 62 includes the subject matter of any of Examples 53-61, wherein the semiconductor base consists essentially of monocrystalline silicon.

Example 63 includes the subject matter of any of Examples 53-62, wherein the semiconductor material consists essentially of bulk silicon.

Example 64 includes the subject matter of any of Examples 53-61 further comprising providing a substrate comprising an insulator, wherein the semiconductor base is formed on the insulator.

Example 65 includes the subject matter of Example 53-64, wherein the transistor is selected from a field-effect transistor (FET), a metal-oxide-semiconductor FET (MOSFET), a tunnel-FET (TFET), a planar transistor, a finned transistor, a Fin-FET, a tri-gate FET, a nanowire FET, a nanoribbon FET, an N-channel transistor, and a P-channel transistor.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. An integrated circuit (IC) with at least one transistor, the IC comprising:
    a semiconductor fin comprising a subfin layer of a subfin material, the subfin material being a first group III-V compound; and
    a channel layer of a channel material directly on the subfin layer and extending upwardly therefrom, the channel material being a second group III-V compound different from the first group III-V compound; and
    a gate structure in direct contact with the channel layer of the semiconductor fin, wherein the gate structure is further in direct contact with a liner layer of semiconductor liner material in direct contact with opposing sidewalls of the subfin layer, the semiconductor liner material being distinct from the first and second group III-V compounds.

2. The IC of claim 1 comprising the liner layer of semiconductor liner material in direct contact with opposing sidewalls of the subfin layer and further comprising an insulator layer distinct from and in direct contact with the liner layer, wherein the liner layer is between the insulator layer and the subfin layer.

3. The IC of claim 1, wherein the subfin layer has a subfin width that is at least 2 nm greater than a channel width of the channel layer as measured where the channel layer meets the subfin layer.

4. The IC of claim 3 further comprising a residual layer of non-$SiO_2$ dielectric on opposing sidewalls of the channel layer, the residual layer of non-$SiO_2$ dielectric having a thickness less than 2 nm.

5. The IC of claim 1, comprising the gate structure in direct contact with the liner layer, and wherein the semiconductor liner material has a lattice mismatch that is no greater than 4% with respect to the channel material.

6. The IC of claim 5, wherein the channel material has virtually no stacking faults.

7. The IC of claim 1, wherein the channel material comprises indium and phosphorous.

8. The IC of claim 7, wherein the subfin layer comprises gallium and arsenic.

9. The IC of claim 7, comprising the gate structure in direct contact with the liner layer, and wherein the semiconductor liner material comprises indium, gallium, and arsenic.

10. The IC of claim 7, wherein the channel layer has a carrier mobility of at least 400 cm.sup.2/vs.

11. A transistor comprising:
    a semiconductor fin comprising a subfin layer of a first group III-V material on the substrate; and
    a channel layer of a second group III-V material on the subfin layer;
    a layer of insulating material adjacent the subfin layer;
    a liner of semiconductor liner material on sidewalls of the subfin layer and the layer of insulating material, wherein the liner is between the layer of insulating material and the subfin layer;
    a gate structure above and on opposing sidewalls of the channel layer;
    a source region adjacent the gate structure; and
    a drain region adjacent the gate structure;
    wherein the channel layer has a carrier mobility of at least 400 $cm_2$/vs.

12. The transistor of claim 11, wherein the channel layer has virtually no defects emanating from sidewalls of the fin layer.

13. The transistor of claim 11, wherein the semiconductor liner material has a lattice mismatch that is no greater than 4% with respect to the second group III-V material on the subfin layer.

14. The transistor of claim 13, wherein the channel layer comprises indium and phosphorous.

15. The transistor of claim 11 further comprising a residual layer of non-$SiO_2$ dielectric on opposing sidewalls of the channel layer, the residual layer of non-$SiO_2$ dielectric having a thickness less than 2 nm.

16. The transistor of claim 15, wherein the residual layer of non-SiO2 dielectric is selected from silicon nitride, aluminum oxide, hafnium oxide, and titanium dioxide.

17. A method of forming a transistor, the method comprising:
    defining a trench in an insulating layer disposed on a semiconductor base, the trench having trench sidewalls extending at least to a top surface of the semiconductor base;

forming a first material in the trench and in direct contact with the semiconductor base, the first material comprising a group IV or a group III-V material;

removing the insulating layer to expose the first material;

forming a cladding layer over the first material and the semiconductor base;

forming a second insulating layer on the cladding layer;

polishing to remove the cladding layer and second insulating layer from a top surface of the first material;

recessing the first material in the trench, thereby defining a lined trench with lined trench sidewalls extending up from a subfin of the first material;

forming a fin of a second material in the lined trench and in direct contact with the subfin; and recessing the cladding layer and the insulating layer to expose the fin of the second material.

18. The method of claim 17, wherein the cladding layer comprises (i) indium, gallium, and arsenic, (ii) indium, gallium, and arsenic in a ratio of 0.53:0.47:1.0, (iii) a group III-V semiconductor material compositionally different from the second material, (iv) silicon and nitrogen, (v) aluminum and oxygen, (vi) hafnium and oxygen, or (vii) titanium and oxygen.

* * * * *